United States Patent
Tavakkoli Kermani Ghariehali

(10) Patent No.: US 11,243,466 B2
(45) Date of Patent: Feb. 8, 2022

(54) TEMPLATE WITH MASS VELOCITY VARIATION FEATURES, NANOIMPRINT LITHOGRAPHY APPARATUS THAT USES THE TEMPLATE, AND METHODS THAT USE THE TEMPLATE

(71) Applicant: CANON KABUSHIKI KAISHA, Tokyo (JP)

(72) Inventor: Amir Tavakkoli Kermani Ghariehali, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 193 days.

(21) Appl. No.: 16/264,214

(22) Filed: Jan. 31, 2019

(65) Prior Publication Data

US 2020/0249566 A1  Aug. 6, 2020

(51) Int. Cl.
G03F 7/00 (2006.01)
B29C 59/02 (2006.01)
B29C 64/20 (2017.01)

(52) U.S. Cl.
CPC .......... *G03F 7/0002* (2013.01); *B29C 59/026* (2013.01); *B29C 64/20* (2017.08)

(58) Field of Classification Search
CPC .... B29C 59/026; B29C 59/022; G03F 7/0002
See application file for complete search history.

(56) References Cited

U.S. PATENT DOCUMENTS

| 6,936,194 | B2 | 8/2005 | Watts |
| 7,157,036 | B2 | 1/2007 | Choi et al. |
| 8,066,930 | B2 | 11/2011 | Sreenivasan et al. |
| 8,076,386 | B2 | 12/2011 | Xu et al. |
| 8,349,241 | B2 | 1/2013 | Sreenivasan et al. |
| 2009/0020071 | A1 | 8/2009 | Khusnatdinov et al. |
| 2011/0171340 | A1 | 7/2011 | Resnick et al. |
| 2014/0284846 | A1 | 9/2014 | Takekawa et al. |
| 2015/0140149 | A1 | 1/2015 | Lu et al. |
| 2015/0158240 | A1* | 6/2015 | Haase ............... G03F 7/0002 264/293 |
| 2016/0091788 | A1 | 4/2016 | Aritsuka et al. |
| 2017/0129144 | A1 | 5/2017 | Yamashita |
| 2018/0104888 | A1* | 4/2018 | Ye .................. B29C 37/0025 |

FOREIGN PATENT DOCUMENTS

| JP | 2013-033878 A | 2/2013 |
| JP | 2017-092218 A | 5/2017 |

OTHER PUBLICATIONS

Amir Tavakkoli Kermani Ghariehali, Edward Brian Fletcher, U.S. Appl. No. 15/804,433, filed Nov. 6, 2017.
Edward W. Washburn, The Dynamics of Capillary Flow, The Physical Review, 17(3):273-283, Mar. 1, 1921, American Physical Society, College Park, MD, 1921.

* cited by examiner

*Primary Examiner* — Joseph S Del Sole
*Assistant Examiner* — Mohamed K Ahmed Ali
(74) *Attorney, Agent, or Firm* — Daniel Ratoff

(57) ABSTRACT

An imprinting apparatus, a method of manufacturing an article, with a template having at least one mass velocity variation feature in a region that alters the filling rate of formable material in the second region surrounding a pattern region. The altered filling rate varies from a first filling rate, at a center of an outer edge of the region to a second filling rate, at corners of the outer edge of the region. The second filling rate is greater than the first filling rate.

12 Claims, 25 Drawing Sheets

100

108

TEMPLATE WITH MASS VELOCITY VARIATION FEATURES, NANOIMPRINT LITHOGRAPHY APPARATUS THAT USES THE TEMPLATE, AND METHODS THAT USE THE TEMPLATE

BACKGROUND

Field of Art

The present disclosure relates to templates with mass velocity variation features and systems and methods of shaping a film on a substrate with a template with mass velocity variation features.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The patterning process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer are then subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

SUMMARY

At least a first embodiment, may be a template for imprinting formable material on a substrate. The template comprising a first region having pattern features. The template may further comprise a second region surrounding the first region. The second region may include at least one mass velocity variation feature that alters the filling rate of the formable material through the second region, while the template is in contact with the formable material on the substrate. The altered filling rate varies from a first filling rate, at a center of an outer edge of the second region to a second filling rate, at corners of the outer edge of the second region. The second filling rate is greater than the first filling rate.

In an aspect of the first embodiment, the mass velocity variation feature may have a first etch depth and a width that proportionally varies from the center of the outer edge of the second region to the corners of the outer edge of the second region.

In an aspect of the first embodiment, the width may be wider in the center of the outer edge of the second region relative to the corners of the outer edge of the second region.

In an aspect of the first embodiment, the first region may be rectangular. The second region may have at least four mass velocity variation features.

In an aspect of the first embodiment, the second region may include a plurality of outer edges. Multiple mass velocity variation features may be associated with each of the plurality of outer edges.

In an aspect of the first embodiment, each of the multiple mass velocity variation features may have a width that varies along the length of each of the multiple mass velocity variation features.

In an aspect of the first embodiment, the mass velocity variation feature may have a depth that varies throughout the mass velocity variation feature.

In an aspect of the first embodiment, the template may further include at least one alignment features. The mass velocity variation feature may have a third filling rate in the region of the at least one alignment feature that is between the first filing rate and the second filling rate.

At least a second embodiment, may be an imprinting apparatus. The imprinting apparatus may comprise: a template chuck configured to hold a template; a substrate chuck configured to hold a substrate; a dispenser configured to dispense a plurality of droplets of formable material in a droplet pattern on the substrate; a positioning system configured to bring a patterning surface into contact with the formable material in an imprint field of the substrate. The template may have: a first region having pattern features; and a second region surrounding the first region. The second region may include at least one mass velocity variation feature that alters the filling rate of the formable material through the second region, while the template is in contact with the formable material on the substrate. The altered filling rate varies from a first filling rate at a center of an outer edge of the second region, to a second filling rate at corners of the outer edge of the second region. The second filling rate may be greater than the first filling rate.

In an aspect of the second embodiment, an unetched portion of the template may be held at a distance $h_{unetched}$ from the substrate.

In an aspect of the second embodiment, the mass velocity variation feature may have a width $w_{slow}$ that varies from the center of the outer edge of the second region to the corners of outer edge of the second region in accordance with the following equation:

$$w_{slow}(y) = v_{measured}\sqrt{\frac{h_{unetched}^3}{h_{measured}}} * \left(\frac{Td}{h_{etched}} - \frac{td(y)}{h_{etched} - h_{unetched}}\right)$$

Wherein y is a distance from the center of the outer edge of the second region along the outer edge. Wherein $v_{measured}$ is the measured velocity of a fluid front of formable material between the template and the unetched portion of a test template that is held a height $h_{measured}$ above the substrate when there is no mass velocity variation feature in the region of the test template. Wherein Td is a measured difference between time it takes the fluid front of formable material to reach the center of the outer edge of the region and time it takes the fluid front to reach the corners of the outer edge of the region when there is no mass velocity variation feature in the region of the test template. Wherein td(y) is an estimate of the additional time it takes the fluid front to reach a position a distance y relative to the time it takes the fluid front to reach the center of the outer edge of the region. Wherein $h_{etched}$ is a height of a gap between the mass velocity variation feature and the substrate.

In an aspect of the second embodiment, td(y) is a linear function that intercepts with zero at center of the outer edge of the region.

In an aspect of the second embodiment, td(y) is a linear function that intercepts with zero at center of the outer edge of the region, except for one or more increases in the additional time associated with one or more alignment features in the template.

In an aspect of the second embodiment, the mass velocity variation feature is divided into N sub-portions in which N is greater than two; each sub-portion i has a width $w_{slow,i}$ that varies from the center of the outer edge of the second region to the corners of outer edge of the second region in accordance with the following equation:

$$w_{slow,i}(y) = v_{measured}\sqrt{\frac{h_{unetched}^3}{h_{measured}}} * \left(\frac{Td}{h_{etched,i}} - \frac{td(y)}{h_{etched,i} - h_{unetched}}\right)$$

Wherein y is a distance from the center of the outer edge of the second region along the outer edge. Wherein $v_{measured}$ is the measured velocity of a fluid front of formable material between the template and the unetched portion of a test template that is held a height $h_{measured}$ above the substrate when there is no mass velocity variation feature in the region of the test template. Wherein Td is a measured difference between time it takes the fluid front of formable material to reach the center of the outer edge of the region and time it takes the fluid front to reach the corners of the outer edge of the region when there is no mass velocity variation feature in the region of the test template. Wherein td(y) is an estimate of the additional time it takes the fluid front to reach a position a distance y relative to the time it takes the fluid front to reach the center of the outer edge of the region. Wherein $h_{etched,i}$ is a height of a gap between the sub-portion i of the mass velocity variation feature and the substrate.

In an aspect of the second embodiment, the region may have a plurality of mass velocity variation features that have a width $w_{slow,m}$ that varies from the center of the outer edge of the second region to the corners of outer edge of the second region and the width $w_{slow,m}$ also varies in accordance with the droplet pattern on the substrate.

At least a third embodiment, is a method of manufacturing an article may comprise: holding a template in a template chuck; holding a substrate in a substrate chuck; dispensing a plurality of droplets of formable material in a droplet pattern on the substrate; bringing a patterning surface into contact with the formable material in an imprint field of the substrate to form a pattern in the formable material; and processing the substrate on which the pattern is formed. The template may have: a first region having pattern features; and a second region surrounding the first region. The second region may include at least one mass velocity variation feature that alters the filling rate of the formable material through the second region, while the template is in contact with the formable material on the substrate. The altered filling rate varies from a first filling rate at a center of an outer edge of the second region, to a second filling rate at corners of the outer edge of the second region. The second filling rate is greater than the first filling rate.

In an aspect of the third embodiment, an unetched portion of the template may be held at a distance $h_{etched}$ from the substrate.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1:
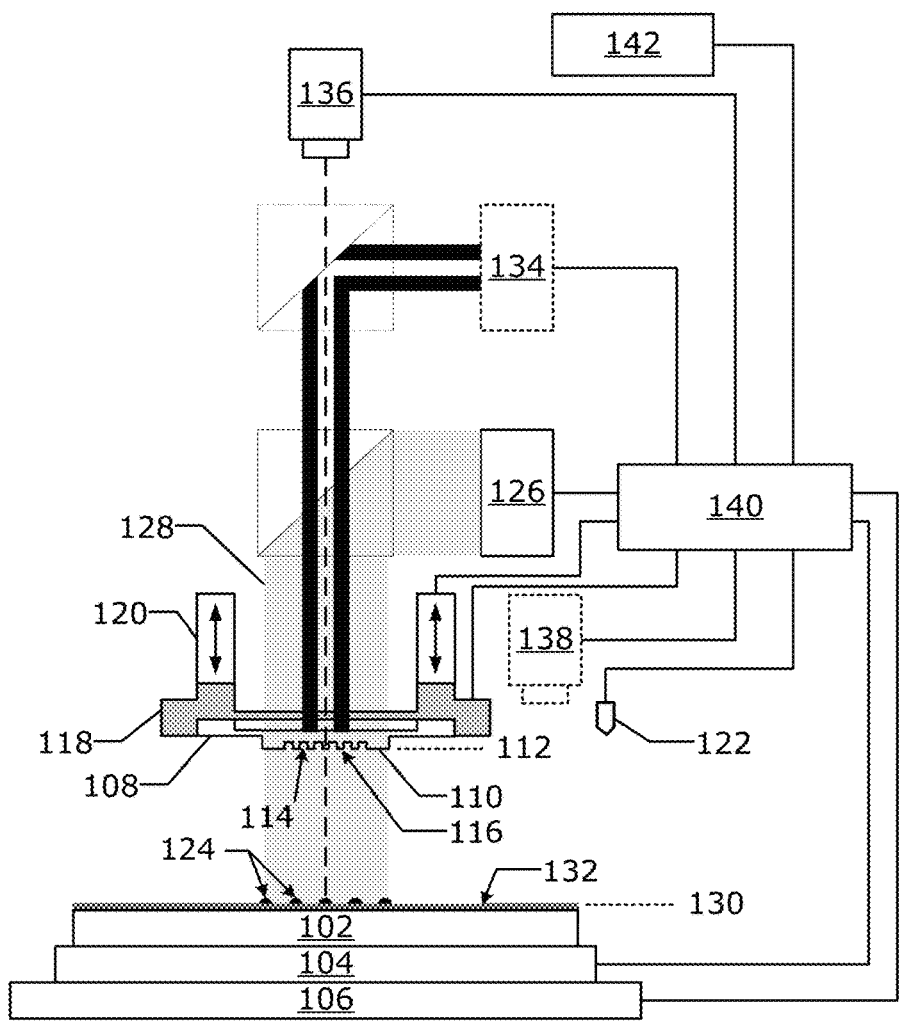
FIG. 1 is an illustration of an exemplary nanoimprint lithography system having a template with a mesa spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The formable material may be deposited onto an imprint field on the substrate as a plurality of droplets. The template is then brought into contact with the plurality of droplets causing the droplets to spread. While, bringing the template into contact with the formable material, the template is distorted such that a central portion of the template is brought into contact with the formable material prior to the edge of the template being brought into contact with the formable material. This may be done to help prevent gas from being trapped under the template. An unintended consequence of this is that the formable material reaches the middles of the edges of the imprint field prior to the formable material reaching the corners. This can create extrusion type defects that reduce the yield of the imprint process. What is needed is a template, system and/or method in which the formable material reaches the middles of the edges of the template around the same time as the formable material reaches the corners of the template.

Nanoimprint System (Shaping System)

FIG. 1 is an illustration of a nanoimprint lithography system 100 in which an embodiment may be implemented. The nanoimprint lithography system 100 is used to form a relief pattern on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head may include one or more actuators such as voice coil motors, piezoelectric motors, linear motor, nut and screw motor, etc, which are configured to move the template chuck 118 relative to the substrate in at least the z-axis direction, and potentially other directions (e.g. x, y, θ, y, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has made contact with the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108, the separation of the template 108 from cured formable material, and can be used to keep track the progress over the imprinting process.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatial temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has made contact with the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136 and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form the planar layer with a featureless patterning surface 112.

The imprinting process may be done repeatedly in a plurality of imprint fields that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template

Figure 2:
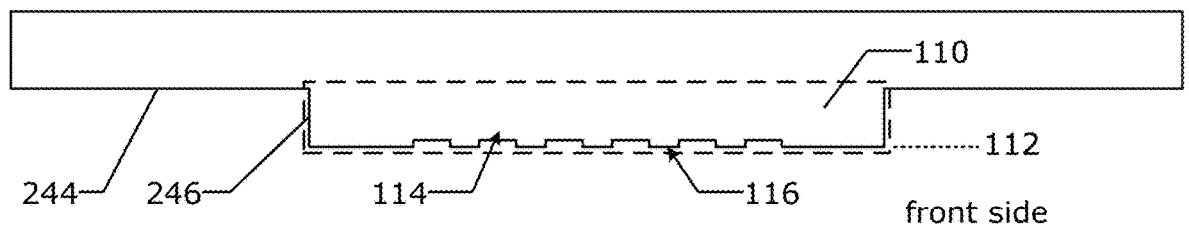
FIG. 2 is an illustration of an exemplary template that may be used in an embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

Imprinting Process

Figure 3:
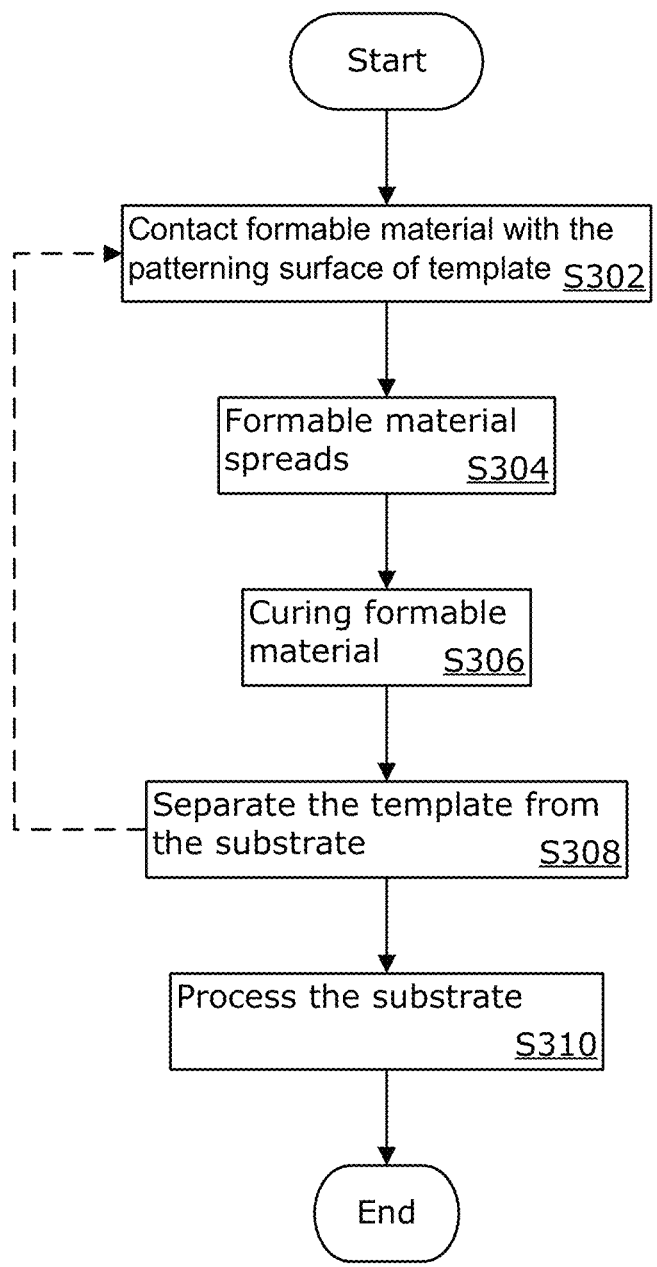
FIG. 3 is a flowchart illustrating an exemplary imprinting method as used in an embodiment.

FIG. 3 is a flowchart of an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control imprinting process 300.

In an alternative embodiment, the imprinting process 300 is used to planarize the substrate 102. In which case, the patterning surface 112 is featureless and may also be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprint field i (index i may be initially set to 1) of the substrate 102 to a fluid dispense position below the fluid dispenser 122. The substrate 102, may be divided into N imprint fields, wherein each imprint field is identified by an index i. In which N is a real integer such as 1, 10, 75, etc. $\{N \in \mathbb{Z}^+\}$. In a dispensing step, the processor 140 may cause the fluid dispenser 122 to dispense formable material onto imprint field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i.

After, the droplets are dispensed, then a contacting step S302 may be initiated, the processor 140 may cause one or both of the substrate positioning stage 106 and a template positioning stage to bring the patterning surface 112 of the template 108 into contact with the formable material 124 in imprint field i.

During a spreading step S304, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S306, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S308, the processor 140 uses one or more of the substrate chuck 104, the substrate positioning stage 106, template chuck 118, and the imprint head 120 to separate the patterning surface 112 of the template 108 from the cured formable material on the substrate 102.

If there are additional imprint fields to be imprinted then the process moves back to step S302. In an embodiment, additional processing is performed on the substrate 102 in a processing step S310 so as to create an article of manufacture (e.g. semiconductor device). In an embodiment, each imprint field includes a plurality of devices.

The further processing in processing step S310 may include etching processes to transfer a relief image into the substrate that corresponds to the pattern in the patterned layer or an inverse of that pattern. The further processing in processing step S310 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Contacting Step

The template chuck 118 is configured to hold the template 108 and the substrate chuck 104 is configured to hold the substrate 102. Template chuck 118 may be mounted on the imprint head 120. The imprint head 120 may be configured to control the motion of the template 108 along multiple axes relative to the substrate 102. For example, the imprint head 120 may be a one-axis, three-axis, or six-axis imprint head 120 capable of controlling at least the z-axis. Imprint head 120 may be configured to move the template 108 such that the template 108 applies a contact force F to the formable material 124.

Figure 4:
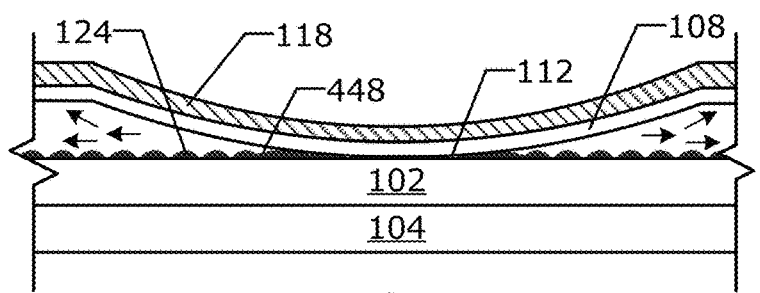
FIG. 4 is an illustration of how back pressure may be applied to the template by the nanoimprint system in an exemplary embodiment.

The template chuck 118 may be configured to apply a back pressure to the template 108 so as to deform the template 108. The substrate chuck 104 may be configured to apply a back pressure to the substrate 102 so as to deform the substrate 102. FIG. 4 is an illustration of back pressure being applied to the template 108 by the template chuck 118 causing a portion of the template 108 to contact a portion of the formable material 124.

As illustrated in FIG. 4, the patterning surface 112 of the template 108 is brought into contact with the droplets of formable material 124. The droplets of formable material 124 are sandwiched between the patterning surface 112 and the substrate surface 130. The droplets of formable material 124 will start to spread and merge forming a fluid front 448. The droplets of formable material 124 may start to spread and merge as soon as they are deposited onto the substrate surface 130. The droplets of formable material 124 may start to spread and merge after the patterning surface 112 contacts the droplets of formable material 124. The spread of the fluid front 448 through an imprint field may be influenced by one or more of: the patterning surface topography; substrate surface topography; capillary pressure due to the gap between the patterning surface and the substrate surface; pressure applied by one or both of the template and substrate to the formable material; wetting angle of the formable material with the substrate surface; wetting angle of the formable material with patterning surface; mass velocity variation features; etc.

Figure 5A:
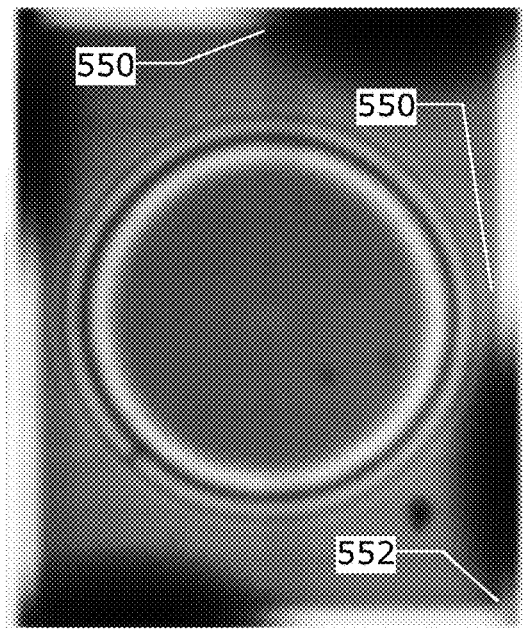
FIGS. 5A-D are illustrations of fluid front of formable material spreading under the template in a nanoimprint system in an exemplary embodiment.
Figure 5B:
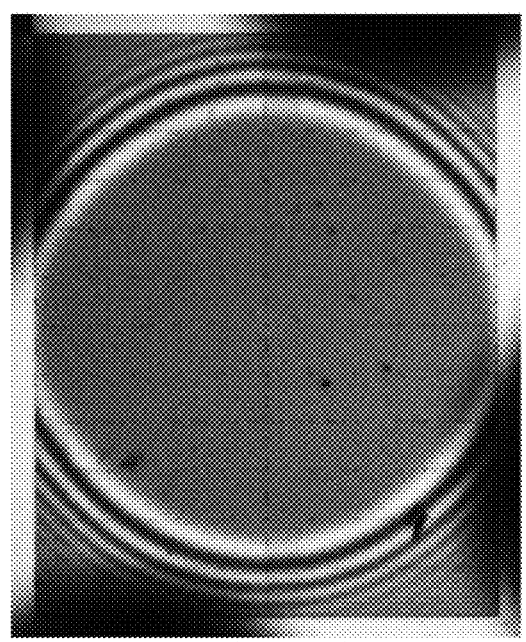
Figure 5C:
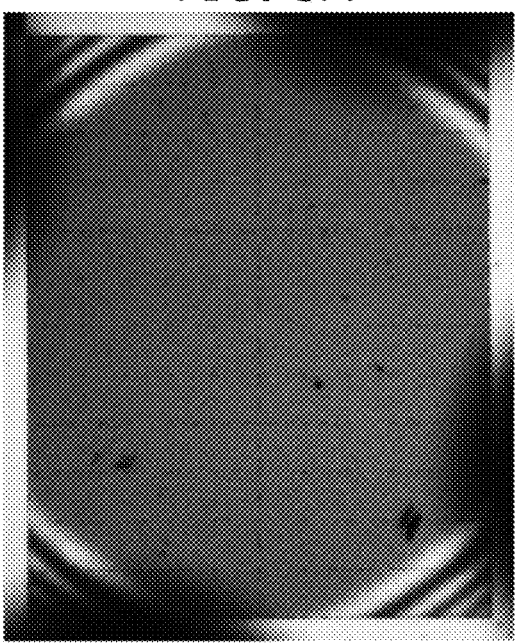
Figure 5D:
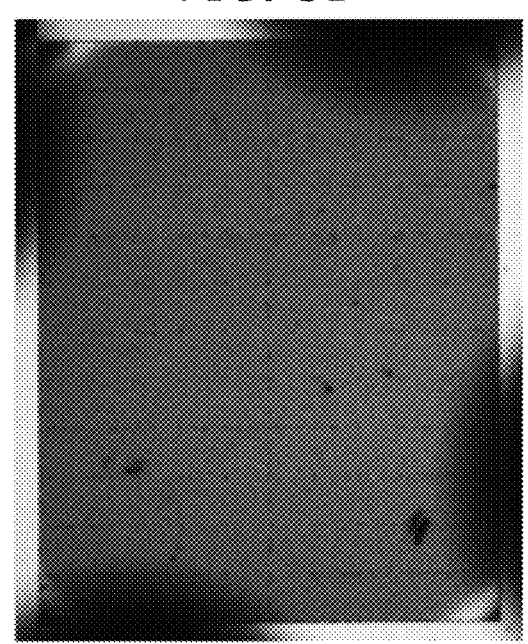

FIGS. 5A-5D are snap-shots of the evolution over time of the fluid front 448 spreading underneath the patterning surface 112. FIG. 5A is a first snap-shot of the fluid front 448, 184 milliseconds (ms) after the patterning surface 112 first contacts the formable material 124, in which the fluid front 448 has maintained a circular shape. FIG. 5B is a second snap-shot of the fluid front 448, 261 ms after the patterning surface 112 first contacts the formable material 124, in which the fluid front 448 has reached two of the centers 550 of a perimeter region of the patterning surface 112 but has not reached the corners 552. The centers 550 are midpoints between two corners 552 on the edge. FIG. 5C is a third snap-shot of the fluid front 448, 338 ms after the patterning surface 112 first contacts the formable material 124, in which the fluid front 448 has reached four of the centers 550 of the perimeter region of the patterning surface 112 but has not reached the corners 552. FIG. 5D is a fourth snap-shot of the fluid front 448, 382 ms after the patterning surface 112 first contacts the formable material 124, in which the fluid front 448 has reached four of the centers 550 of the perimeter region of the patterning surface 112 but has still not reached the corners 552.

The corners 552 of the patterning surface 112 may contact the formable material 124 later than the centers 550 of the perimeter region of the patterning surface 112 this can cause an uneven distribution of the formable material 124. Drops of formable material 124 along the mesa sidewalls 246 at the centers 550 begin to spread about 200 ms (for example) before the patterning surface 112 has flattened and reached the drops at the corners 552.

Filling time differences in the perimeter region at the intersection of the mesa sidewalls 246 and the patterning surface 112 along the outer edge creates a problem for fast filling and control of extrusions. Extrusions can occur when the fluid front 448 of the formable material 124 spreads beyond the imprint field as defined by the mesa sidewalls 246. When the formable material 124 reaches the imprint field edge the height of the gap may greatly increase which slows down the fluid front 448 due to mass conservation. The imprint field edge is the intersection of the mesa sidewalls 246 and the patterning surface 112. The imprint field edge may pin the meniscus of the fluid front 448 and stop it from spreading further. The imprint field edge may not completely stop the fluid front 448, the more time the fluid front 448 spends near the imprint field edge the more likely that formable material may stick to the mesa sidewalls and or flow beyond the imprint field edge and form extrusions.

One method of addressing this problem is to create a drop pattern that has a drop edge exclusion (DEE) that is established to prevent extrusions, in which case the corner may not be filled at all. However, if a DEE is established to fill the corner, extrusions may occur along the edge. As the spread time is reduced to enhance throughput, the filling time difference between middle and corner of the edges will take up a larger portion of the spread time. This may place limits on the ability to reduce the spread time. Moreover, because of the delay time between the middle and the corner of the edges, the number of non-filled defects in corners is more than in the other areas.

Figure 6A:
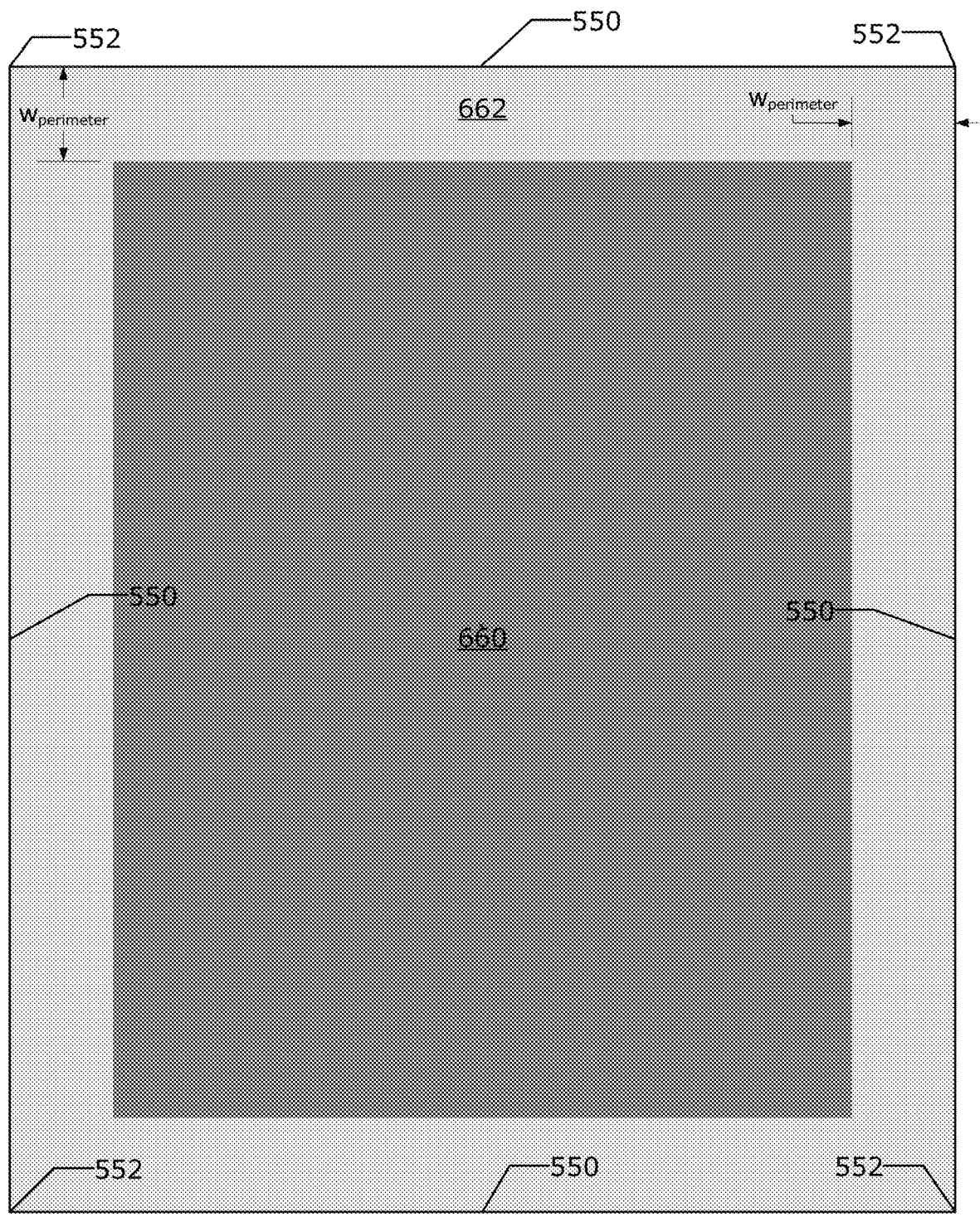
FIGS. 6A-I are illustrations of portions of a template as used in an exemplary embodiments.
Figure 6B:
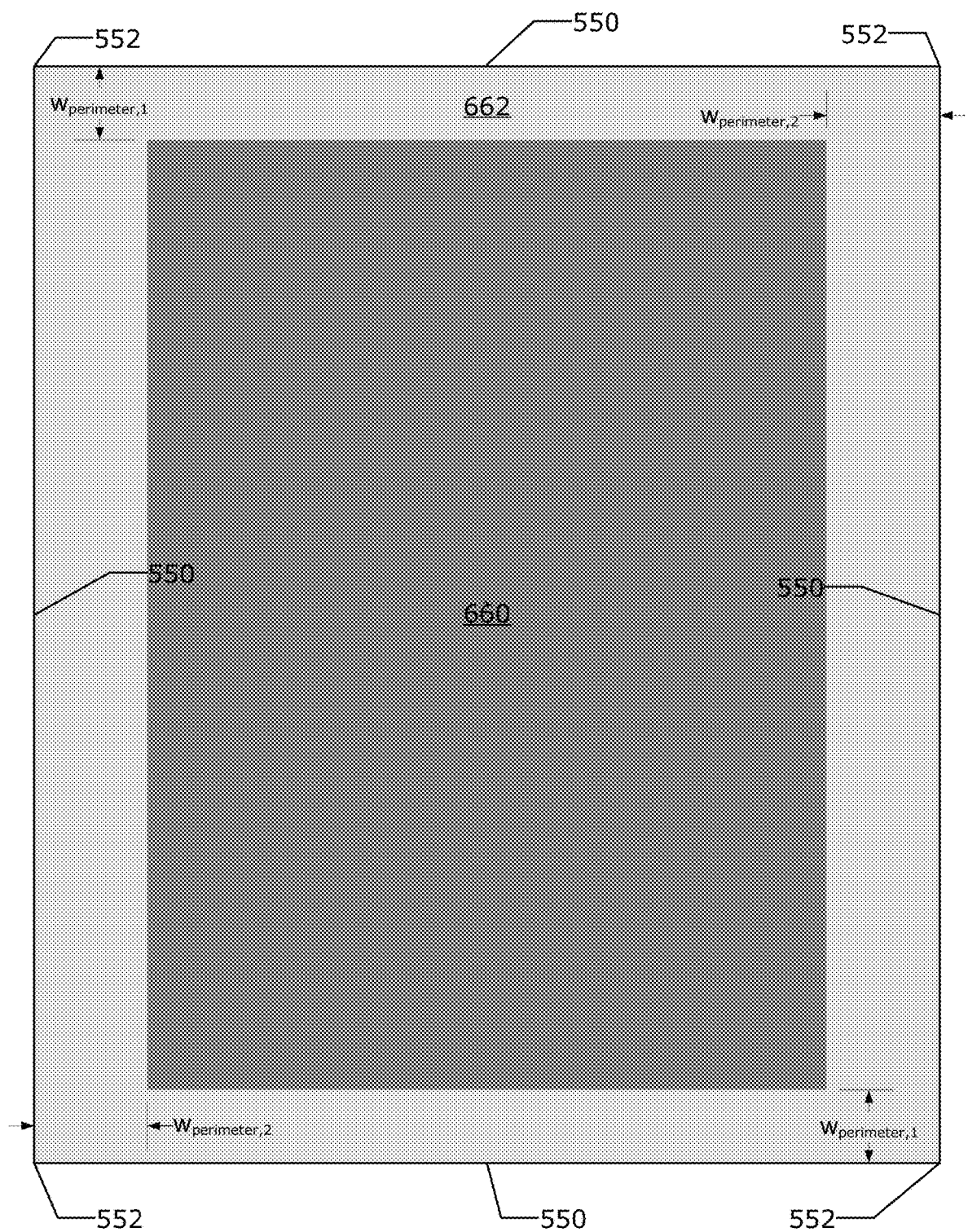

The applicant has found that a template 108 with mass velocity variation features (MVVF) in the perimeter region 662 of the patterning surface 112 can reduce the probability of extrusions being formed. In an alternative embodiment, the perimeter region 662 is region on the patterning surface and is inset relative to the mesa sidewalls 246. The applicant has also found that the design of the MVVF is important to meet the competing goals of: reducing extrusions at the center 550 of the perimeter region 662; reducing the occurrence of non-fill at the corners 552 of the perimeter region 662; and increasing throughput. As illustrated in FIG. 6A (not to scale), the perimeter region is a region of the patterning surface that surrounds the feature region 660. In an embodiment, the intersection of the mesa sidewalls 246 with the patterning surface 112 defines an outer edge of the perimeter region 662. In an embodiment, the inner edge of the perimeter region is inset from the outer edge of the perimeter region by a perimeter region width $w_{perimeter}$ which may be 1 μm, 4 μm, 10 μm, 20 μm, 100 μm, 1 mm, etc. The perimeter region width may be determined by the size of the pattern area and/or the kerf width needed to separate the substrate into multiple devices (articles). In an alternative embodiment, the feature region is asymmetric and the perimeter region also has asymmetric widths $w_{perimeter,1}$ for the short portions of the perimeter region and $w_{perimeter,2}$ for the long portions of the perimeter region as illustrated in FIG. 6B.

The applicant has found that it is advantageous to have a MVVF in the perimeter region 662 that slows down the flow of the fluid front 448 in the centers 550 of the perimeter region 662 relative to the corners 552. Examples of such mass velocity variation features are illustrated in FIGS. 6C-6I. In such a mass velocity variation feature as the distance from the centers 550 of the perimeter region to the corners 552, the width $w_{slow}$ of an etched portion 664a is reduced and the width $w_{fast}$ of un-etched portion is increased. This configuration of the mass velocity variation feature allows the formable material 124 to reach to all parts of the imprint field edge simultaneously without any delay time or less delay time and there is a more uniform filling.

Figure 6C:
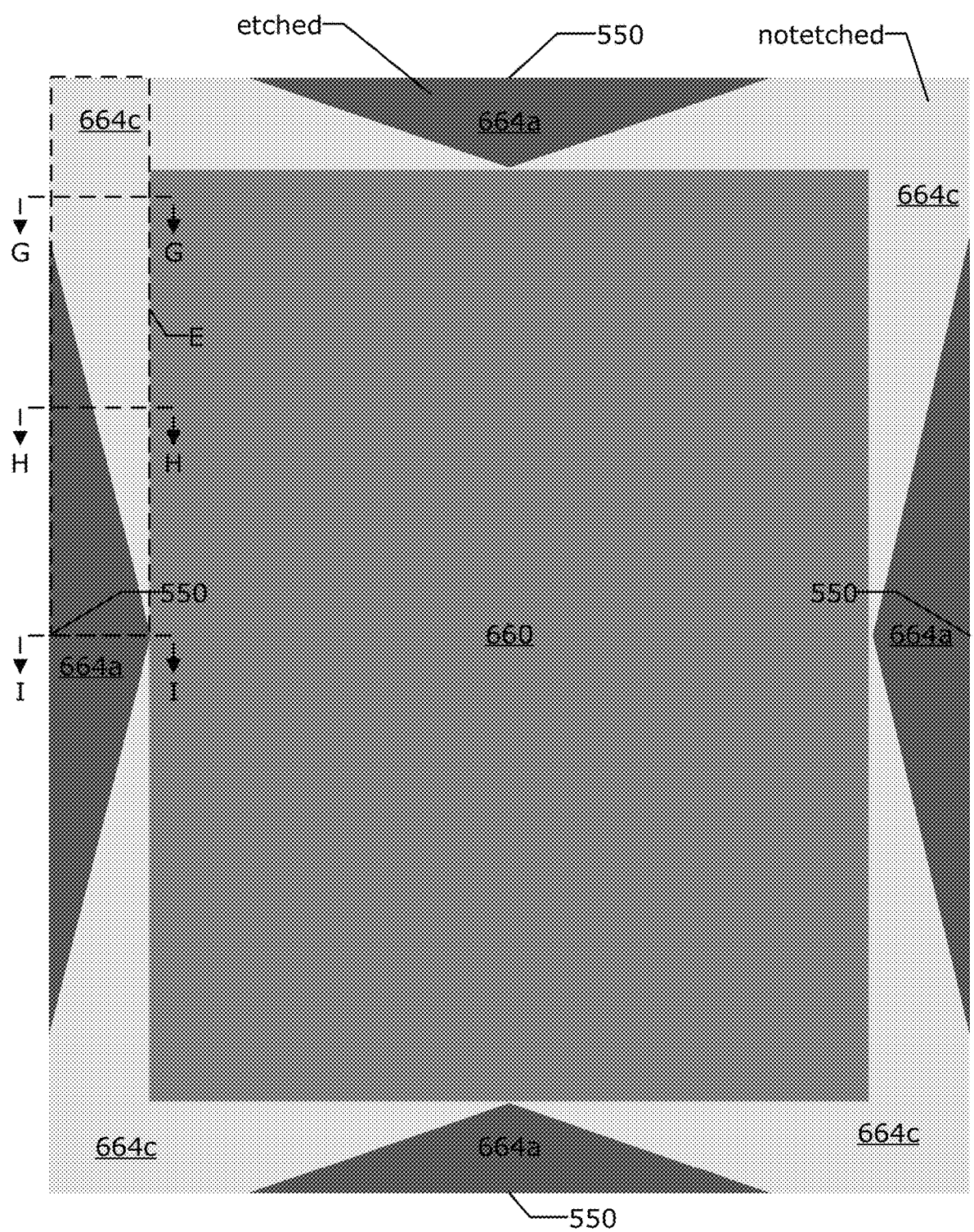
Figure 6D:
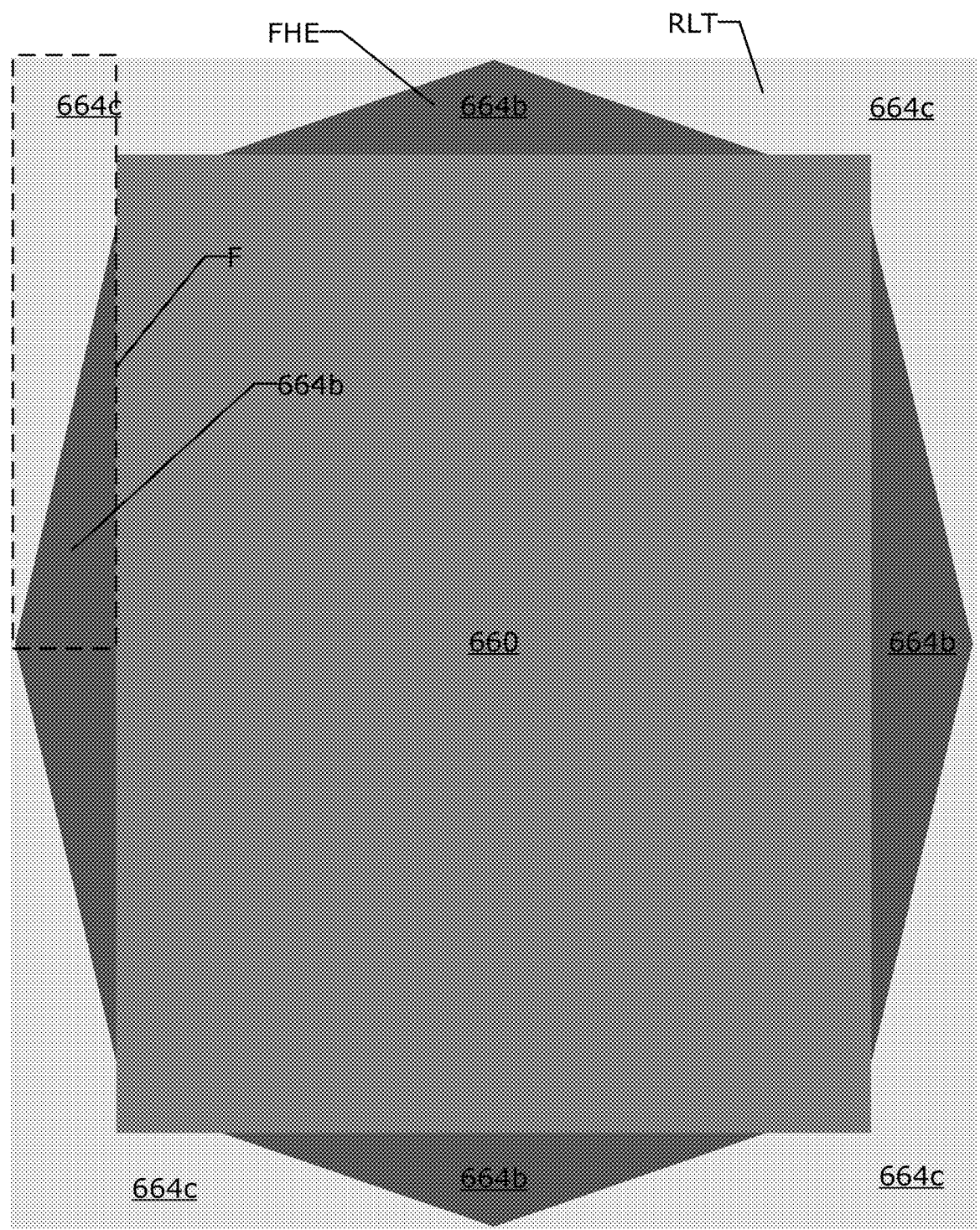

FIGS. 6C-D are plan views of patterning surfaces 112 of templates 108. The patterning surface 112 includes a feature region 660 in the center of the patterning surface 112. The feature region 660 includes recesses 114 and protrusions 116 which will be transferred to the formable material 124 and then be used to create features in the final article produced by the substrate 102. In an embodiment, the depth of the features in the feature region 660 may be on the order 20 nm to 100 nm. The size of the features is not unduly limited and may be 1 nm, 5 nm, 10 nm, 20 nm, 100 nm, 1 µm, 10 µm, etc. The size of the features in the feature region are determined by the size of the devices which are to be created some of which are smaller than 100 nm and may be less 5 nm.

In an embodiment, illustrated in FIG. 6C, the patterning surface 112 includes 4 mass velocity variation features 664a which may take the shape of triangles etched into the perimeter region 662 and whose centers are centered on the centers 550 of the outer edge of the perimeter region 662. In another embodiment, illustrated in FIG. 6D, the patterning surface 112 includes 4 mass velocity variation features 664b which may take the shape of triangles etched into the perimeter region 662 and whose centers are centered on the centers 550 of the outer edge of the perimeter region 662 whose orientation is flipped relative to mass velocity variation feature 664a.

Figure 6E:
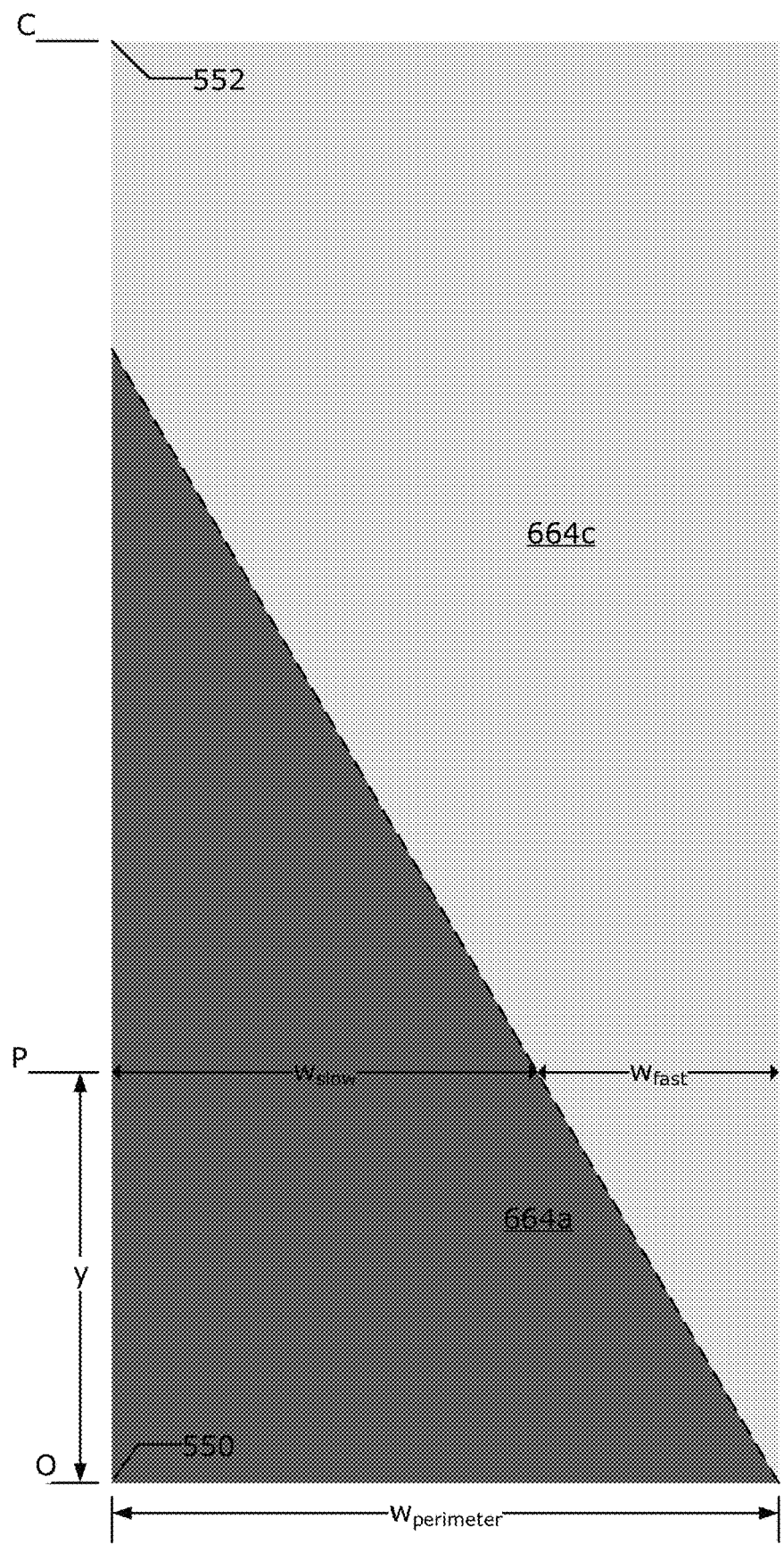

FIG. 6E is a detail view of a portion E of the plan view in FIG. 6C of the perimeter region 662 including a portion of the mass velocity variation features 664b. The perimeter region 662 is divided into at least two regions a fast region 664c and a slow region that is defined by the mass velocity variation features 664a or 664b. The fast region 664c may be a portion of the perimeter region 662 that is un-etched or has a minimal etch depth. The imprinting system 100 is configured to position the template 108 such that there is a residual layer thickness (RLT) formed between the fast region 664c and the substrate 102 with a thickness $h_{unetched}$. There is always a residual layer having a minimum thickness RLT between the template 108 and the substrate of formable material 124.

The mass velocity variation feature 664(a,b) is a feature etched into the perimeter region 662. The mass velocity variation feature 664(a,b) changes the velocity of the fluid front 448 as it passes through the mass velocity variation feature 664(a,b). The mass velocity variation feature 664(a,b) changes the velocity by changing the height of the gap through which the fluid front 448 travels. The width of the mass velocity variation feature 664(a,b) that the fluid front 448 travels through determines the magnitude of that time delay. The mass velocity variation feature 664(a,b) alters the filling rate of the formable material through the perimeter region 662, while the template 108 is in contact with the formable material 124 on the substrate 102. The filling rate of a portion of the mass velocity variation feature is a function of the depth of that portion of the mass velocity variation and the width of the mass velocity variation feature in the direction of the fluid front spread.

Figure 6F:
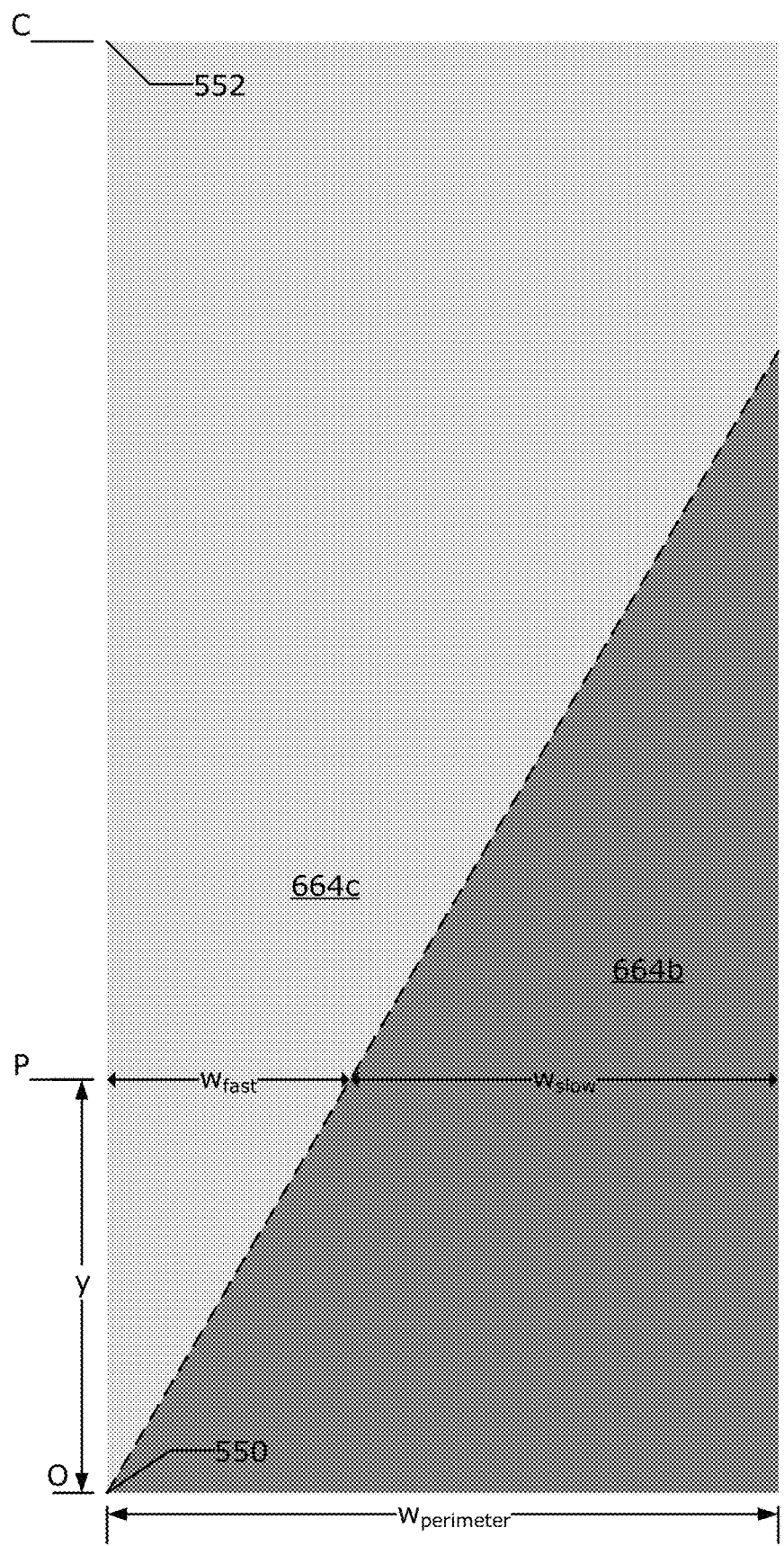

The mass velocity variation feature 664(a,b) may be configured to vary the alteration of the filling rate of the perimeter region 662 across the perimeter region 662. This may be accomplished by varying the width $w_{slow}$ of the mass velocity variation feature 664(a,b) across the perimeter region 662. As illustrated in FIGS. 6E-F the variation the width $w_{slow}$ for a certain point (P)_on the edge of the mass velocity variation feature 664(a,b) varies across the perimeter region such that at an arbitrary point P.

Figure 6G:
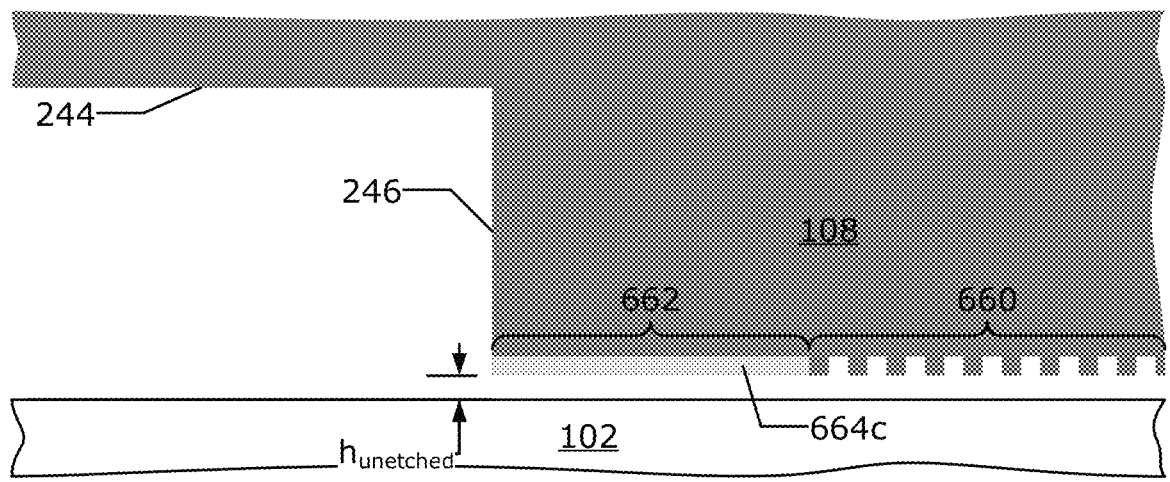
Figure 6H:
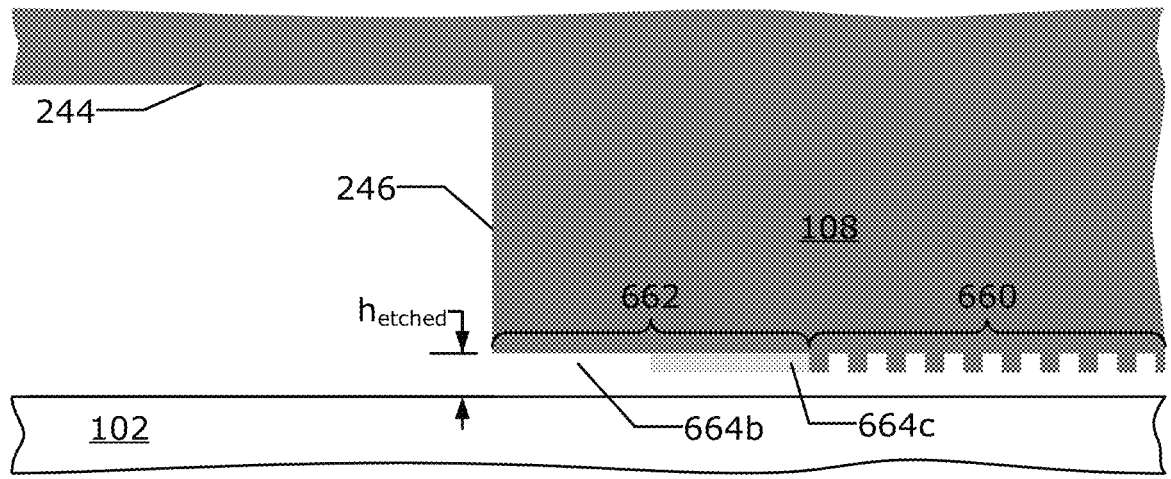
Figure 6I:
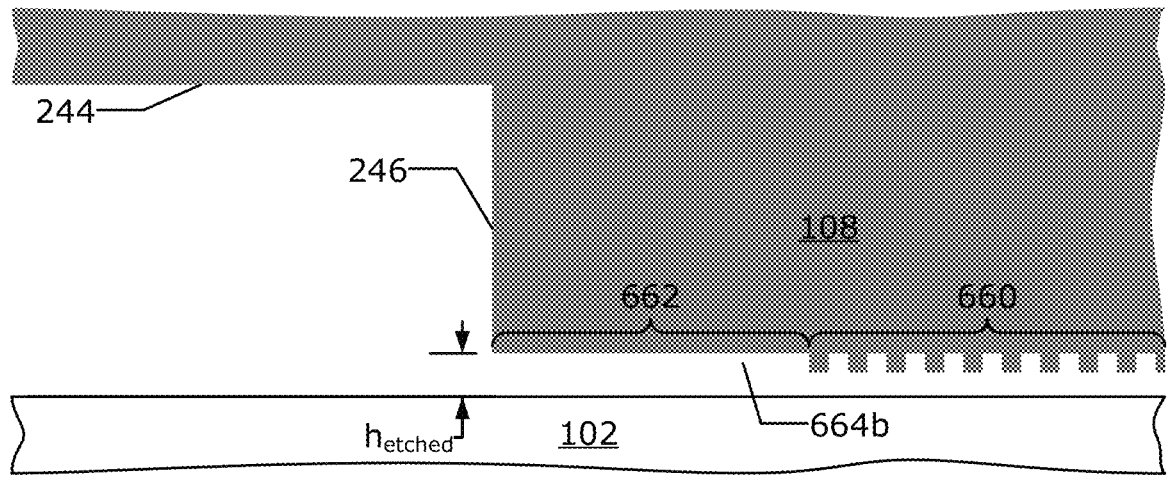

The width $w_{slow}$ is a function of spreading delay time between the point P and a point O at the center 550 of the perimeter region 662 that is a distance y from the center 550 of the perimeter region 662 along each of the mesa sidewalls. Equation (1) below describes how to calculate the width $w_{slow}(y)$ at point P of the variable control feature a distance y from an origin O at the midpoint 550 along each of the mesa sidewalls. The speed of the fluid front through the mass velocity variation feature 664(a,b) is $v_{slow}$. The total delay time Td is difference between the time it takes the fluid front to reach point O and the time it takes the fluid front to reach point C if there is no mass velocity variation feature. The imprint system is configured to position the template about the substrate such that the $h_{unetched}$ is the RLT thickness of the formable material 124 under the fast region 664c of the perimeter region 662 as illustrated in FIG. 6G. FIG. 6G is a sectional view along a cut line G illustrated in FIG. 6C of a portion of the template 108 positioned above a substrate 102. FIG. 6H is a sectional view along a cut line H illustrated in FIG. 6C of a portion of the template 108 positioned above a substrate 102. FIG. 6I is a sectional view along a cut line I illustrated in FIG. 6C of a portion of the template 108 positioned above a substrate 102. The height $h_{etched}$ is the thickness of the formable material under the mass velocity variation feature 664(a,b). The delay time td(y) is the additional time it takes the fluid front to reach a position P (a distance y from the origin O) on the mesa sidewall relative to the time it takes the fluid front to reach the center of the mesa sidewall (origin O). As illustrated in the figures the width of etched portion of the changes over the length of the mass velocity variation feature 664(a,b). In an embodiment, the mass velocity variation features 664(a,b) are symmetric across the centers 550 as illustrated in the figures. In an alternative embodiment, the mass velocity variation features are asymmetric due to asymmetry of the underlying pattern features in the feature region 660.

$$w_{slow}(y) = v_{slow} * Td - td(y) * \left( \frac{v_{slow} * h_{etched}}{h_{etched} - h_{unetched}} \right) \quad (1)$$

Figure 7A:
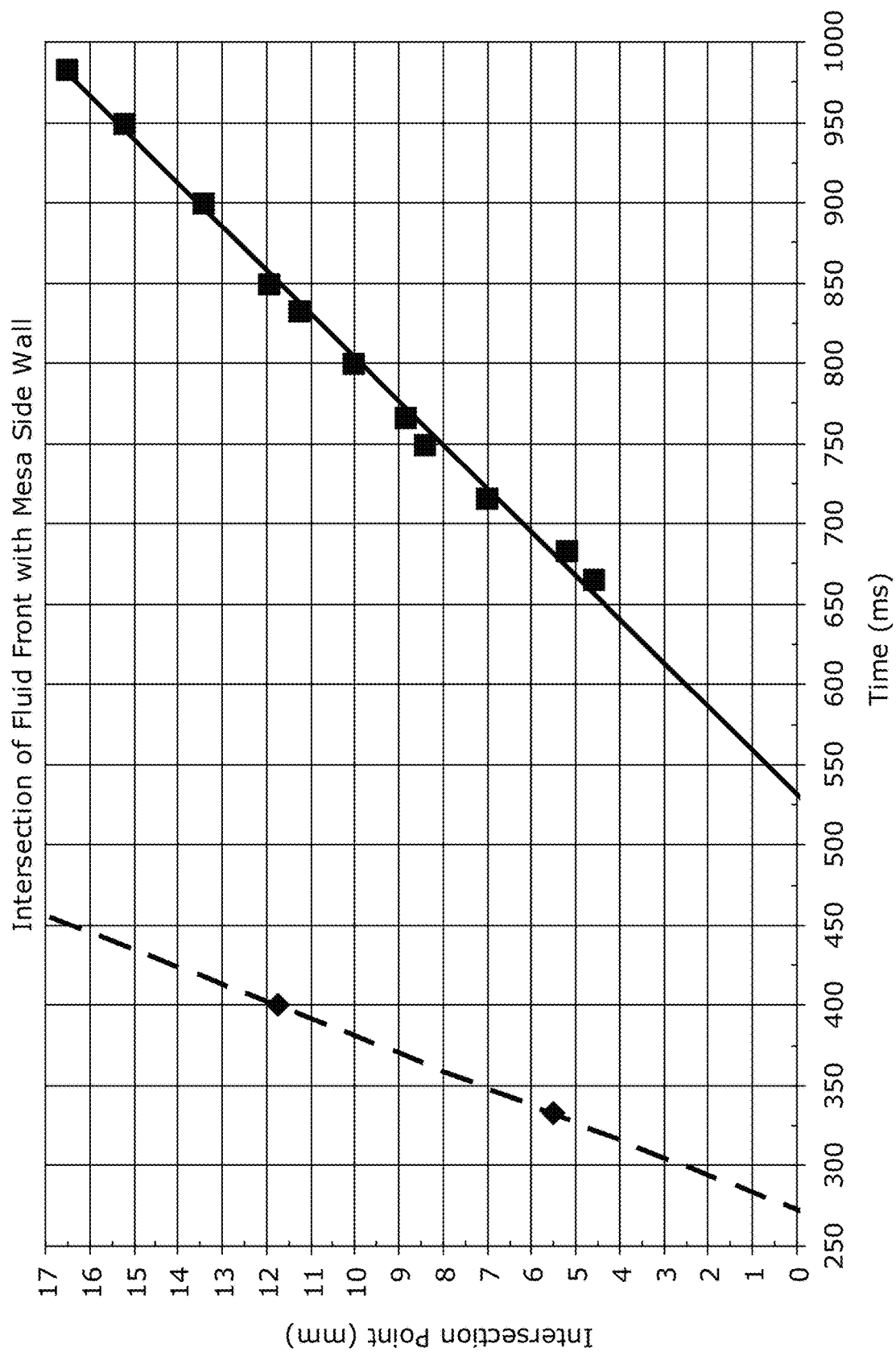
FIGS. 7A-D are charts illustrating data that is relevant to exemplary embodiments.
Figure 7B:
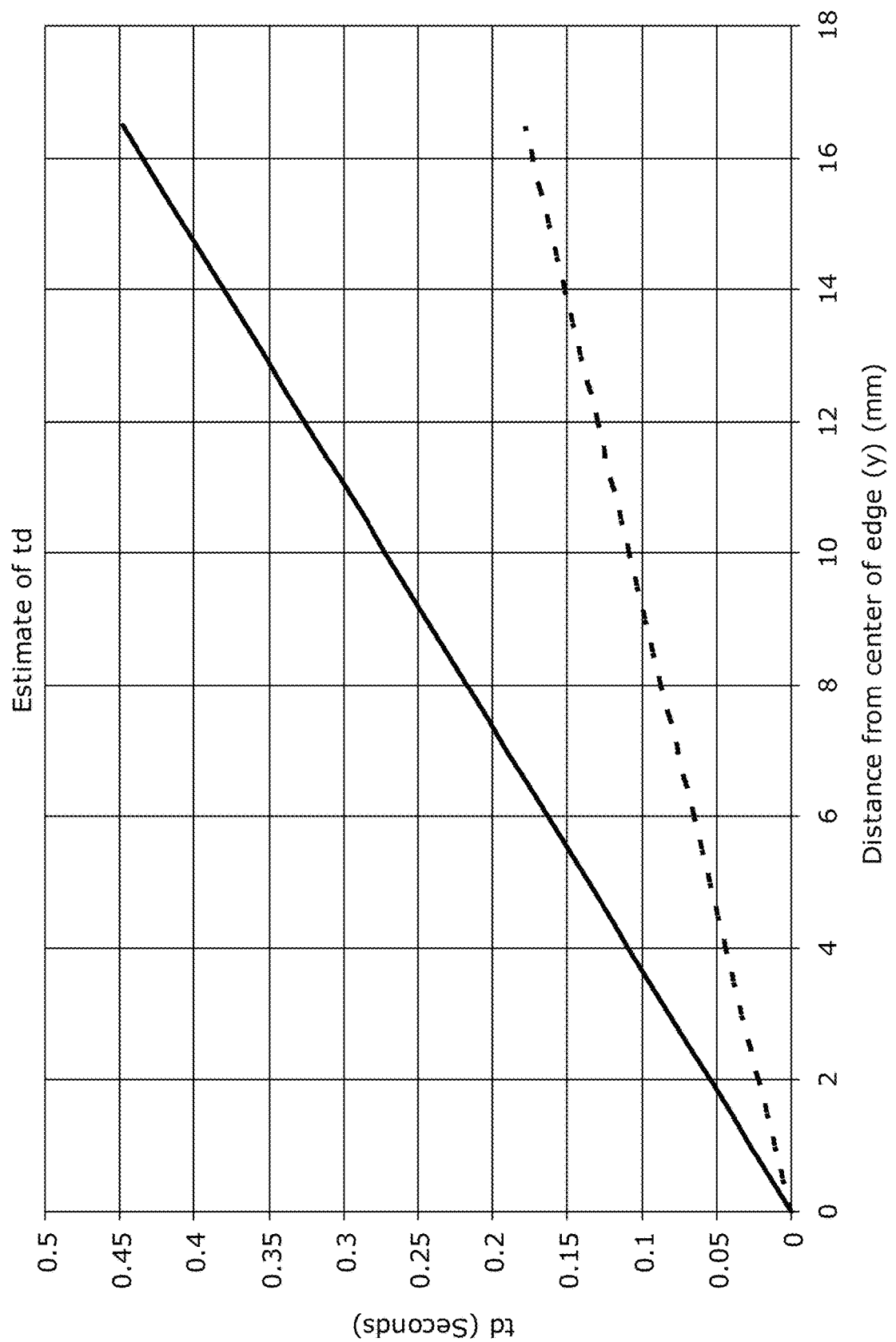

The delay time td(y) may be measured using the field camera 136. FIG. 7A is a chart illustrating two sets of exemplary data which were gathered with the field camera 136 and then used to estimate two different td(y) under two different imprinting parameters. Images of the formable material 124 under a template 108 without a mass velocity variation feature 664(a,b) were taken at a plurality of times after the template 108 made contact with the formable material 124. The intersection point of the fluid front 448 with the mesa sidewall 246 relative to the center (O) of the mesa sidewall 246 was measured for each image taken with the field camera 136. This data was then plotted as illustrated in FIG. 7A, a trend line may then be fitted to the data and be used as an estimate of td(y). In an embodiment, the estimate of td(y) is a linear function with a zero intercept. In an alternative embodiment, the estimate of td(y) is not a linear function. FIG. 7B is a plot of estimated td based on the measurements in FIG. 7A which in this example is td(y)=0.0272*y and td(y)=0.0108*y. In an embodiment, the delay time td(y) is a reflection of the underlying pattern features in the feature region 660.

The velocity $v_{fast}$ of the formable material 124 through a gap with a given height $h_{unetched}$ (RLT) can be measured by allowing the formable material to pass through a gap in the perimeter region 662 between the substrate 102 and the template 108 and curing the formable material 124 at multiple sets of times prior to the formable material 124 reaching the mesa sidewalls 246. The distance that the fluid front 448 has moved can then be measured at a plurality of times. For example the velocity $v_{fast}$ of the formable material as it passes through a 30 nm gap in the perimeter region was measured to be 322 μm/seconds. The velocity $v_{fast}$ of the fluid front may vary for plurality of reasons associated with the material properties of the formable material, the substrate, the template, and the other properties of the imprinting system. In an alternative embodiment, the field camera 136 may be used to estimate the velocity $v_{fast}$.

Using Washburn's equation as applied to nano-channels as described in equation (2) below can be used to show how the velocity $v_{fast}$ of the fluid front changes under different conditions. Washburn's equation (2) below is using the following variables. The penetration distance is X. The contact angle of the liquid to the channel walls is θ. The channel height (here RLT thickness) is h. The surface tension of the liquid in air is γ. The viscosity of the liquid is μ and t is time.

$$X = \sqrt{\frac{\gamma\, ht \cos\theta}{3\mu}} \quad (2)$$

We can use Washburn's equation to see how the penetration distance scales with changes in the channel height (h) as described by equation (3) below.

$$\frac{X_0}{X_1} = \sqrt{\frac{h_0}{h_1}} \quad (3)$$

Figure 7C:
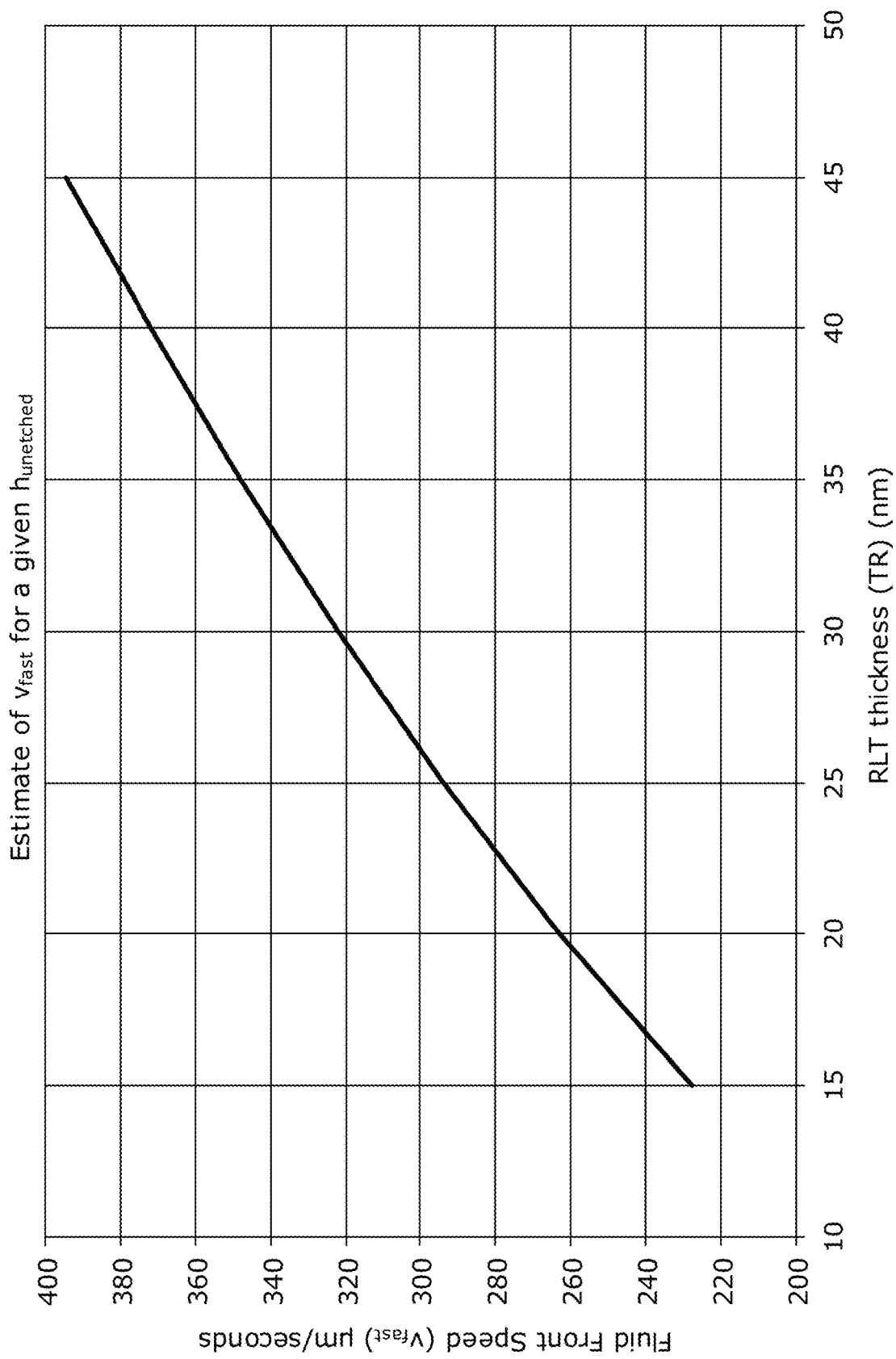

In the context of the present disclosure the penetration distance $X_1$ is proportional to the velocity of the fluid front 448. Which allows us to estimate the speed $v_{fast}$ of the fluid front 448 for various $h_{unetched}$ given one measurement $v_{measured}$ of the velocity of the fluid front 448 for a particular $h_{measured}$ as described by equation (4) below and illustrated in FIG. 7C. When the thickness of the RLT increases, the velocity increases.

$$v_{fast} = v_{measured} \sqrt{\frac{h_{unetched}}{h_{measured}}} \quad (4)$$

The velocity of the fluid front through the mass velocity variation feature 664a may be calculated by assuming the mass flow rate is constant as described by equation (5) below.

$$v_{fast} * h_{unetched} = v_{slow} * h_{etched} \quad (5)$$

$$v_{slow} = \frac{v_{fast} * h_{unetched}}{h_{etched}}$$

$$v_{slow} = \frac{h_{unetched} * v_{measured}}{h_{etched}} \sqrt{\frac{h_{unetched}}{h_{measured}}}$$

Substituting equation (5) into equation (1) allows us to describe the width of the glow region based on the measured values ac shown in equation (6).

$$w_{slow}(y) = v_{measured} \sqrt{\frac{h_{unetched}^3}{h_{measured}}} * \left(\frac{Td}{h_{etched}} - \frac{td(y)}{h_{etched} - h_{unetched}}\right) \quad (6)$$

Figure 7D:
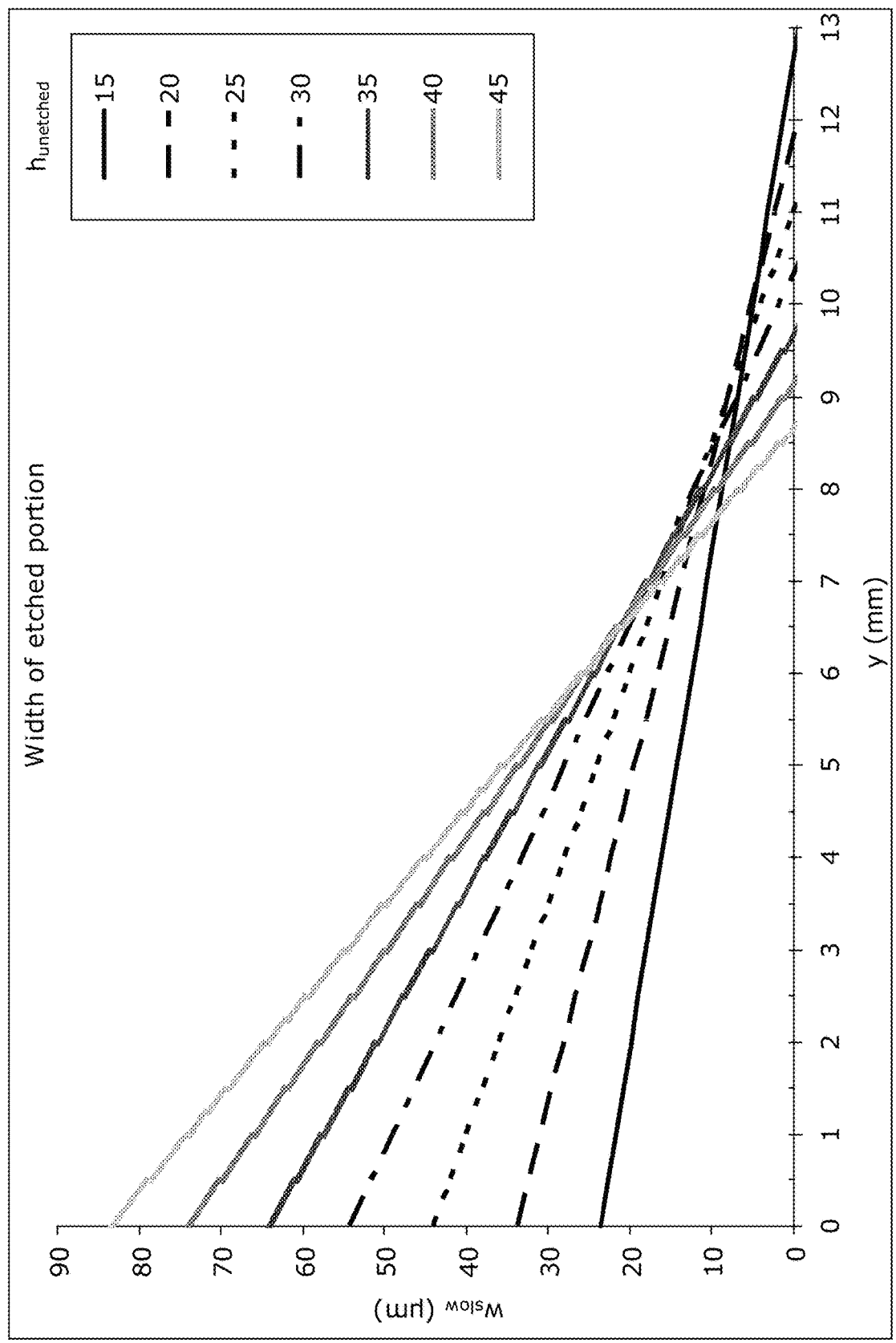

Using the above-mentioned formulas and graphs the width $w_{slow}(y)$ can be calculated for different $h_{unetched}$ as shown in FIG. 7D. For a simple mass velocity variation feature 664(a,b) the max width of the feature is inversely proportional to $h_{etched}$ and scales by $h_{unetched}^{3/2}$. Equation (6) describes the boundary between the slow region and the fast region of the perimeter region for a distance y along each of the mesa sidewalls. In which the variable y describes the distance from the center point 550, both positive and negative along each (3 or more) of the mesa sidewalls.

Template Modified to Take Droplet Pattern into Account

Figure 8A:
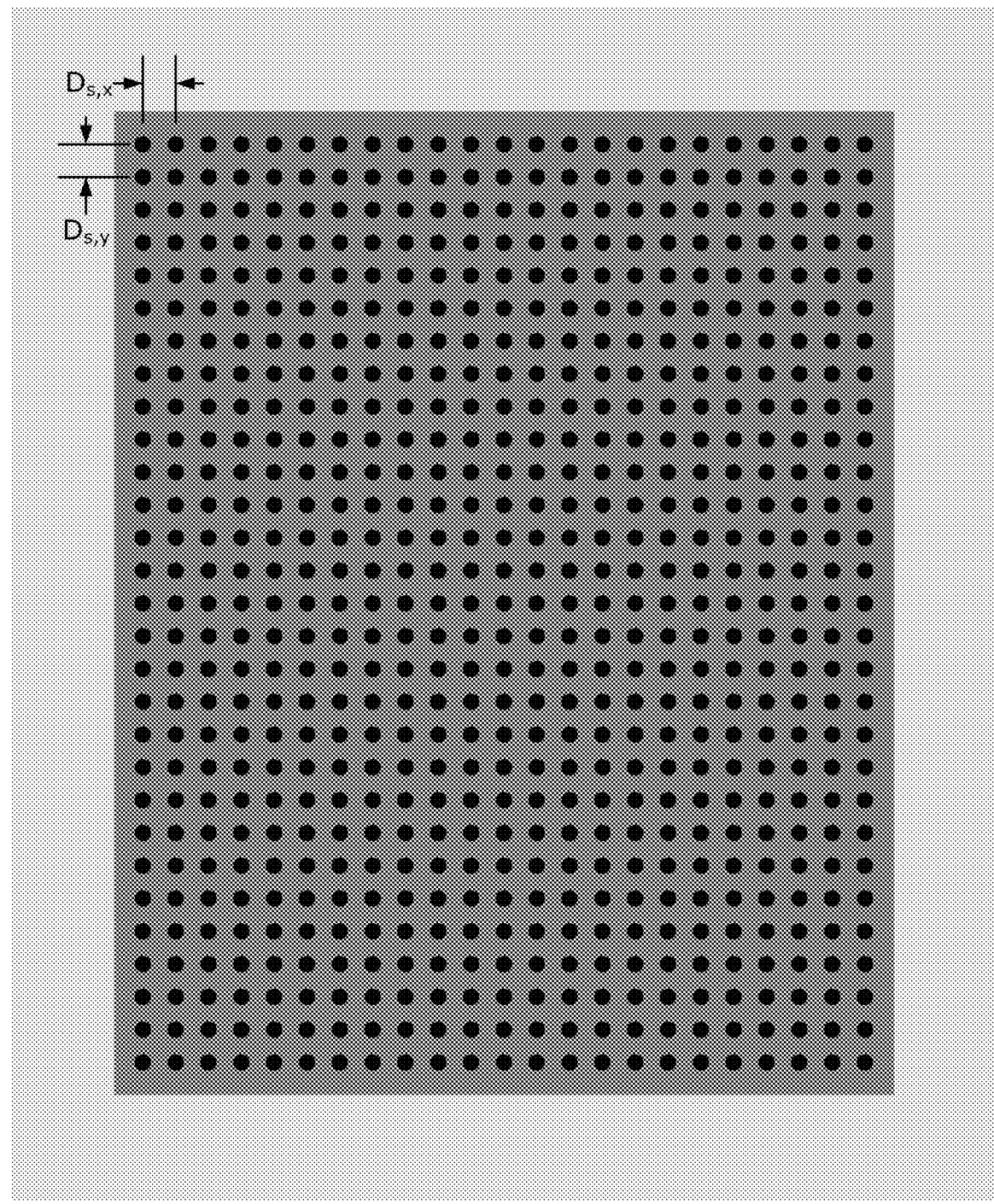
FIGS. 8A-C are illustrations of drop patterns of formable material deposited onto an imprint field of a substrate by a nanoimprint system in an exemplary embodiment.
Figure 8B:
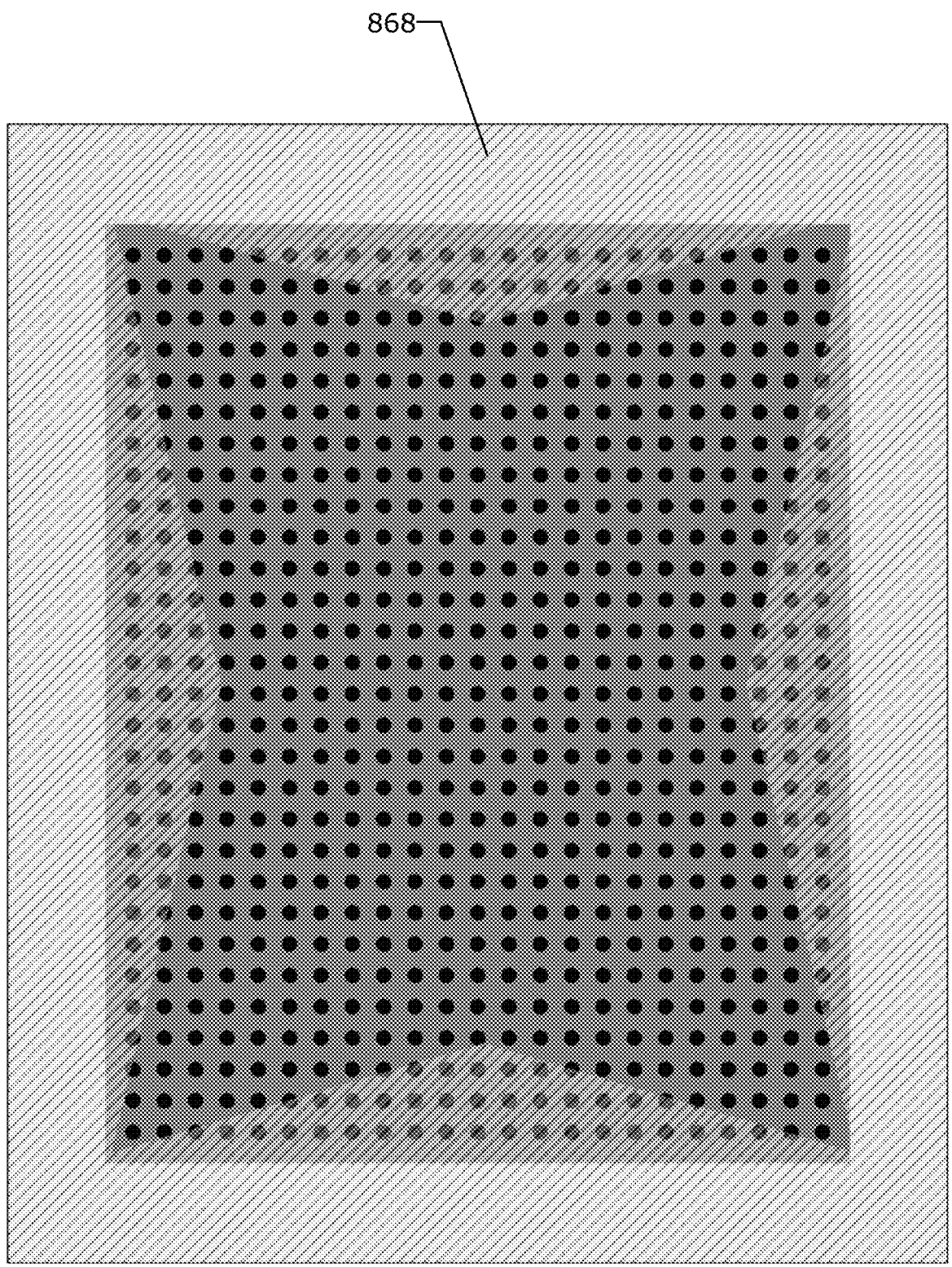
Figure 8C:
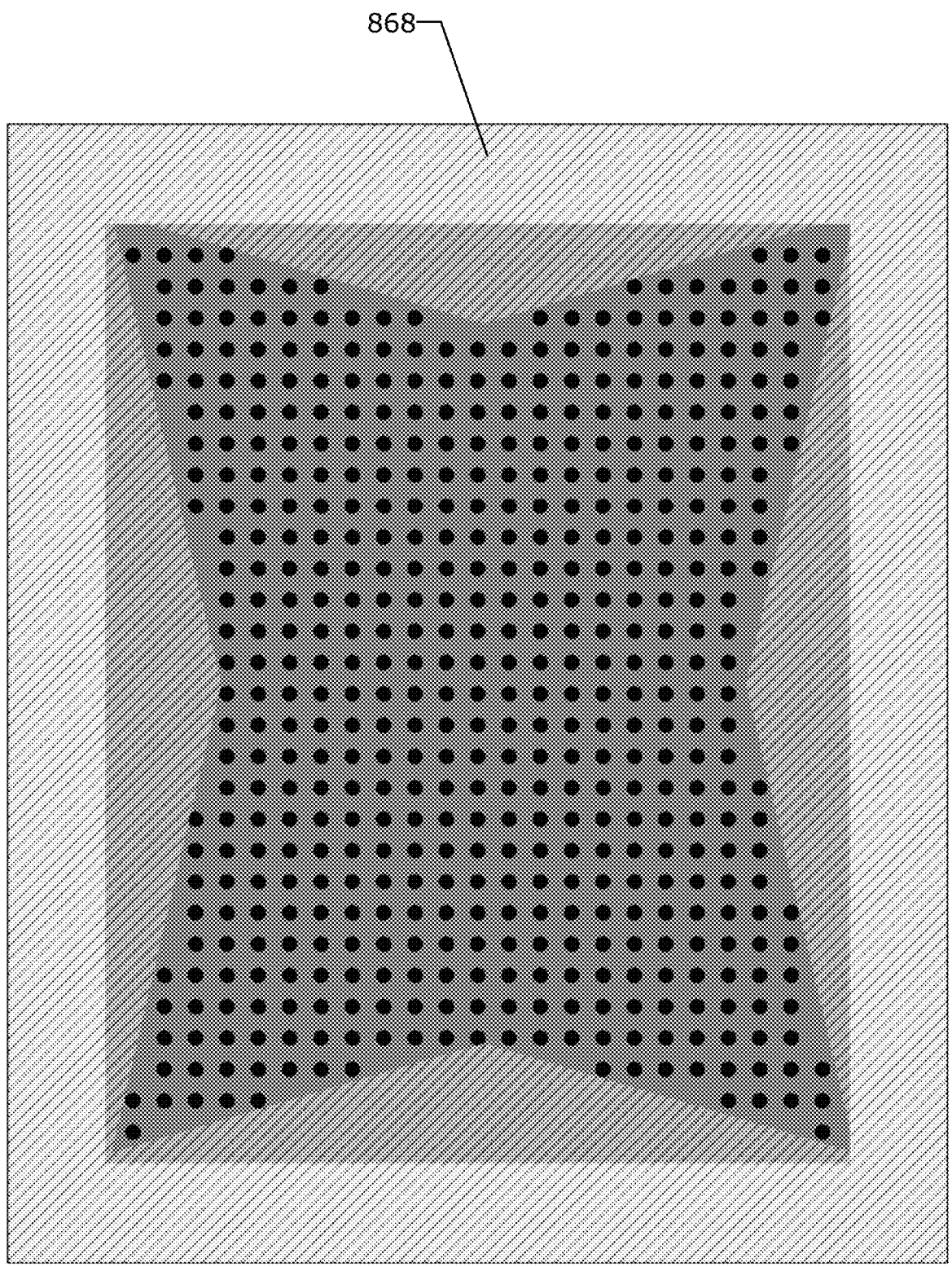

In an alternative embodiment, a template 108 with a mass velocity variation feature 664(a,b) is used in combination with a modified droplet pattern of formable material 124. The fluid droplet pattern may be deposited onto an imprint field of the substrate 102 with a droplet pattern such as the one illustrated in FIG. 8A that is on a regular grid of droplets with a minimum drop spacing $D_{s,x}$ and $D_{s,y}$. The fluid droplet pattern may be configured such that there is a droplet exclusion zone 868 (DEE) at the edges of the imprint field which helps to prevent extrusions from forming, as illustrated in FIGS. 8B-C as a dashed area. The density of droplets in the fluid droplet pattern is also configured to fill the recesses in the substrate 102 and template 108. The fluid dispenser 122, the positioning system, and throughput, place limits on where droplets may be placed, such that droplet placement cannot by itself prevent all extrusions.

In an embodiment, the drop exclusion zone 868 is narrower at a first point farther from a center 550 of the side and wider at a second point closer to the center 550 of the side as illustrated in FIGS. 8B-C. The use of a variable drop exclusion zone in combination with mass velocity variation feature 664(a,b) allows for a narrower MVVF to be used. As illustrated in FIG. 8C, droplets that are positioned within the drop exclusion zone 868 are not deposited onto the imprint field of the substrate 102. The narrower MVVF may be configured to take into consideration the drop spacing $D_s$ of the droplet pattern. In one embodiment, the minimum drop spacing $D_s$ is: 5; 10; 20; 35; 50; or 100 μm. The width of the mass velocity variation feature 664(a,b) may be modified to have a modified width $w_{slow,m}$ that takes into account the discretization of the droplet spacing as described in equation (7).

$$w_{slow,m}(y) = \quad (7)$$

$$\left((Td - td(y)) - D_s * \text{Int}\left(\frac{Td - td(y)}{D_s}\right) - \frac{w_{perimeter}}{v_{fast}}\right)\left(\frac{v_{slow} * v_{fast}}{v_{fast} - v_{slow}}\right)$$

Figure 9A:
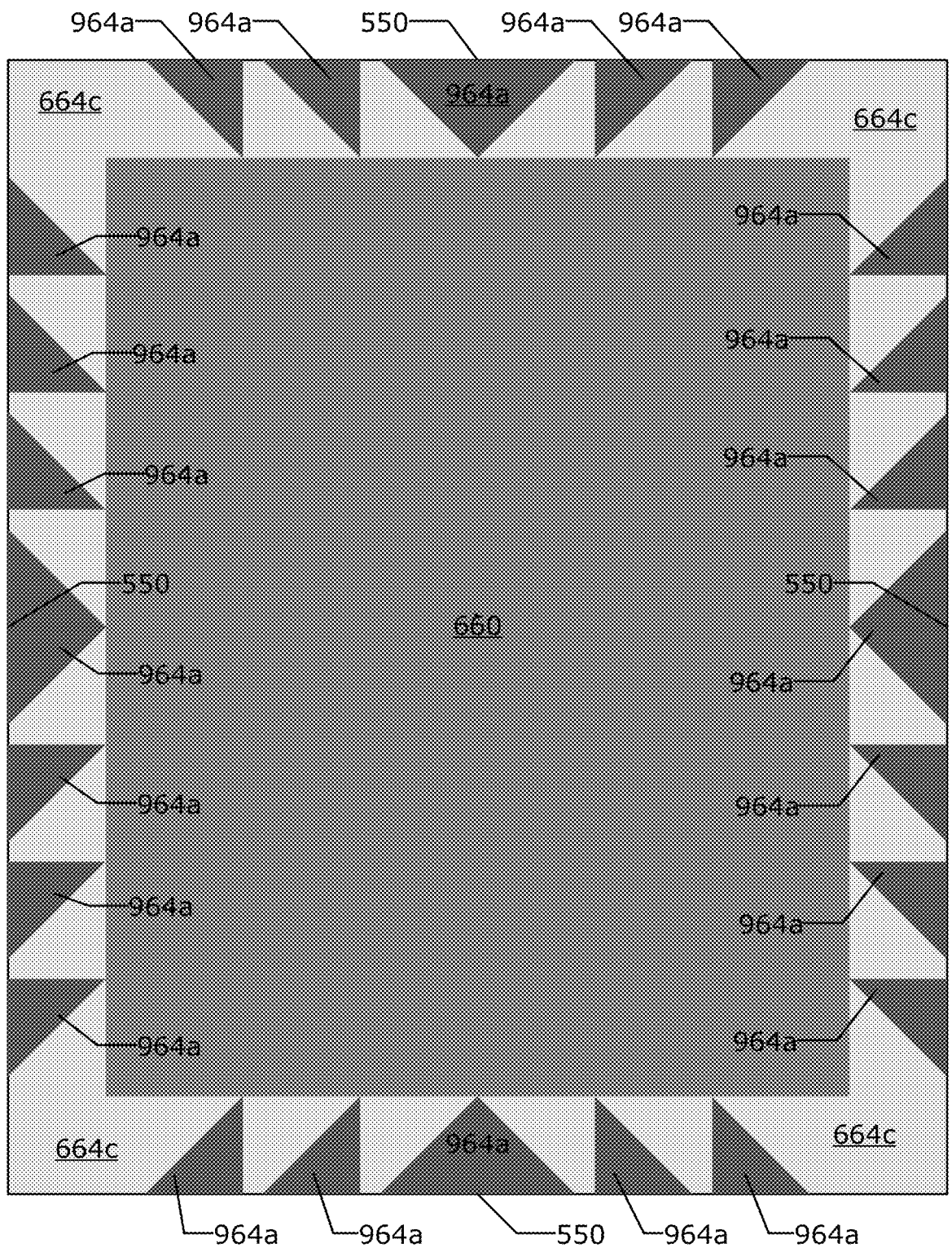
FIGS. 9A-B are illustrations of portions of templates with mass velocity variation features as may be used in an exemplary embodiment.
Figure 9B:
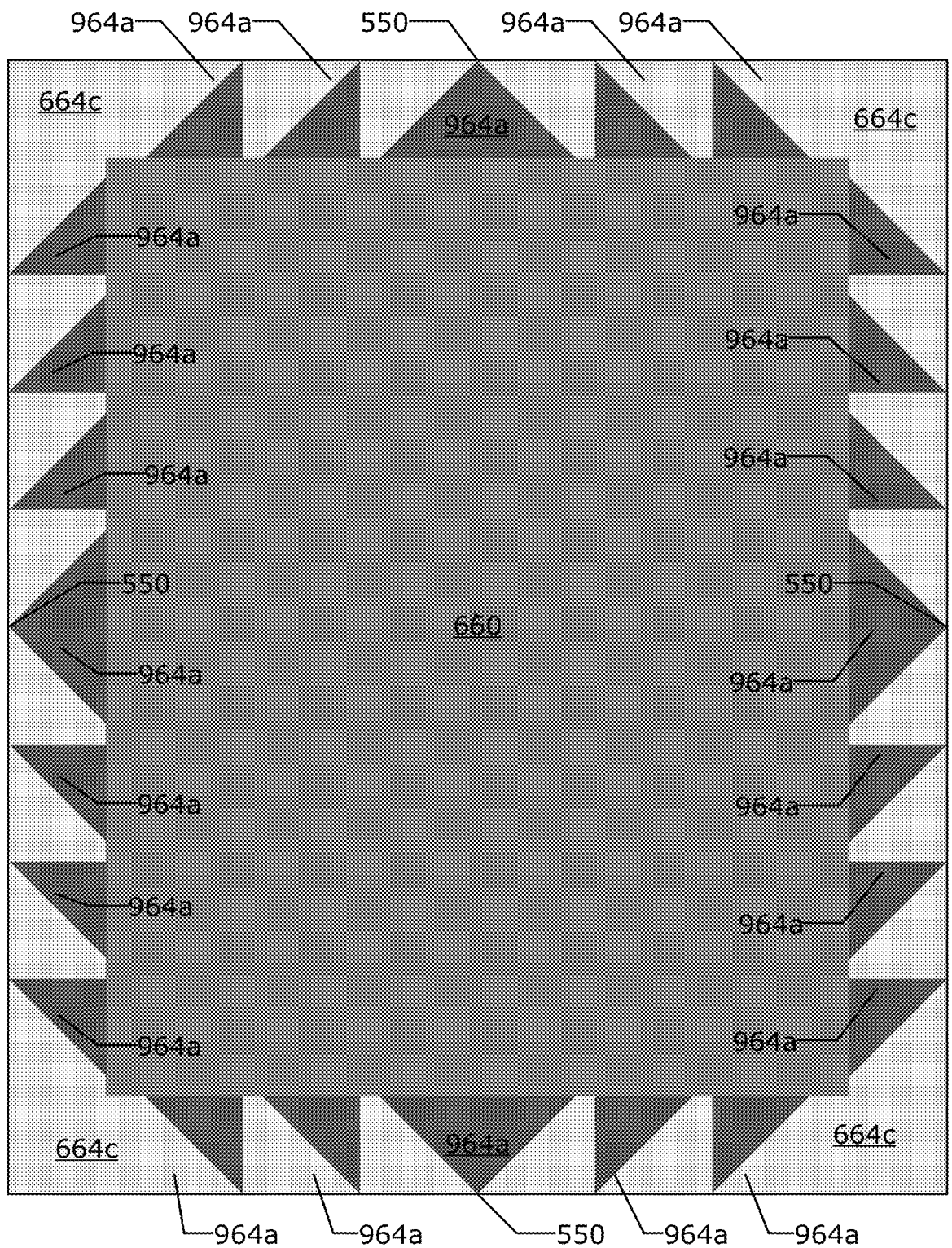

In one embodiment, the drop spacing in one direction $D_{s,x}$ is different than the drop spacing in a second direction $D_{s,y}$, which results in a modified width profile that is different on different sides of the imprint field. FIGS. 9A-9B are illustrations of modified mass velocity variation features 964a that take into account the limits of the droplet spacing $D_s$.

Template with Mass Velocity Variation Feature Etched to Multiple Depths

Figure 10A:
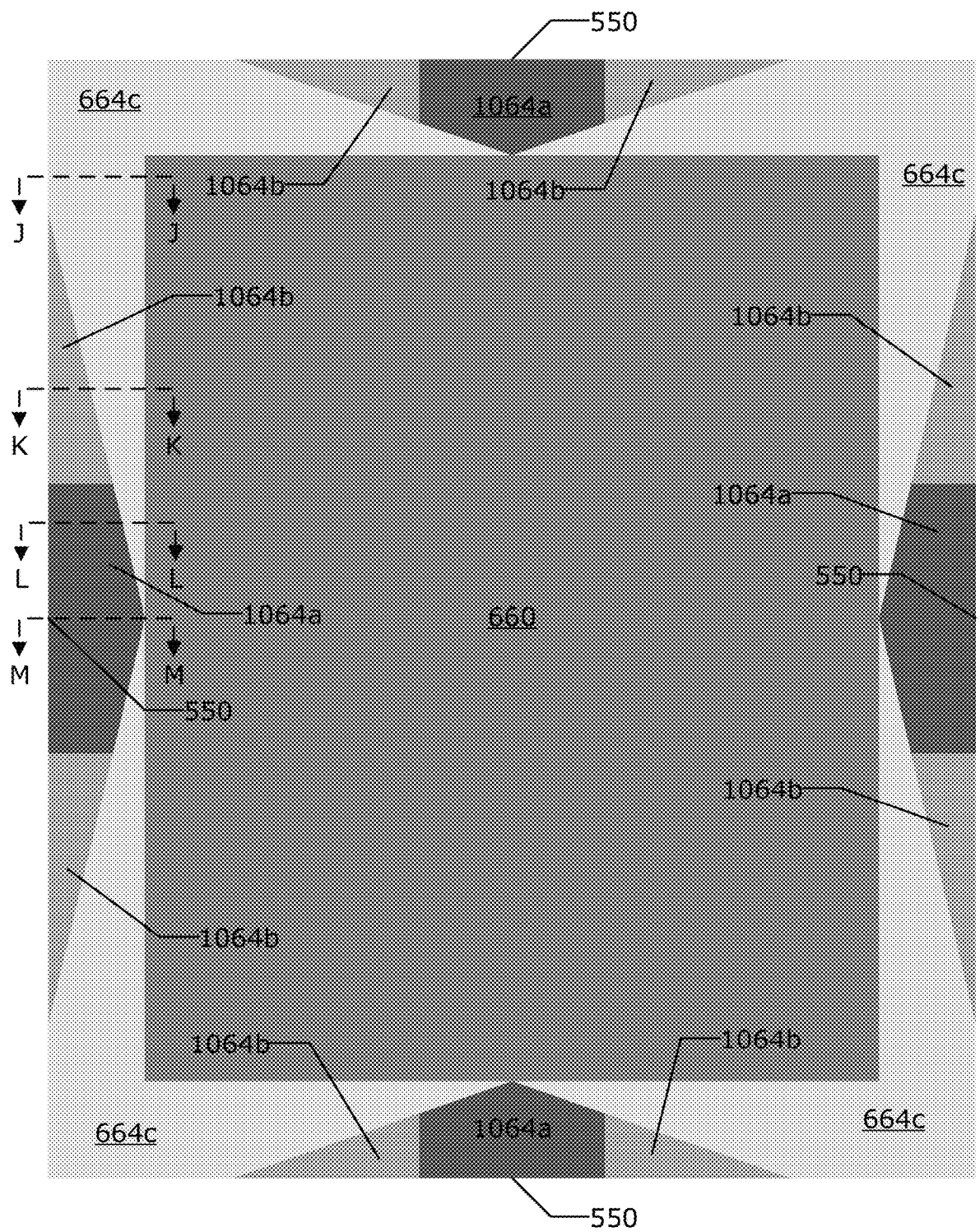
FIGS. 10A-E are illustrations of portions of templates with mass velocity variation features as may be used in an exemplary embodiment.
Figure 10B:
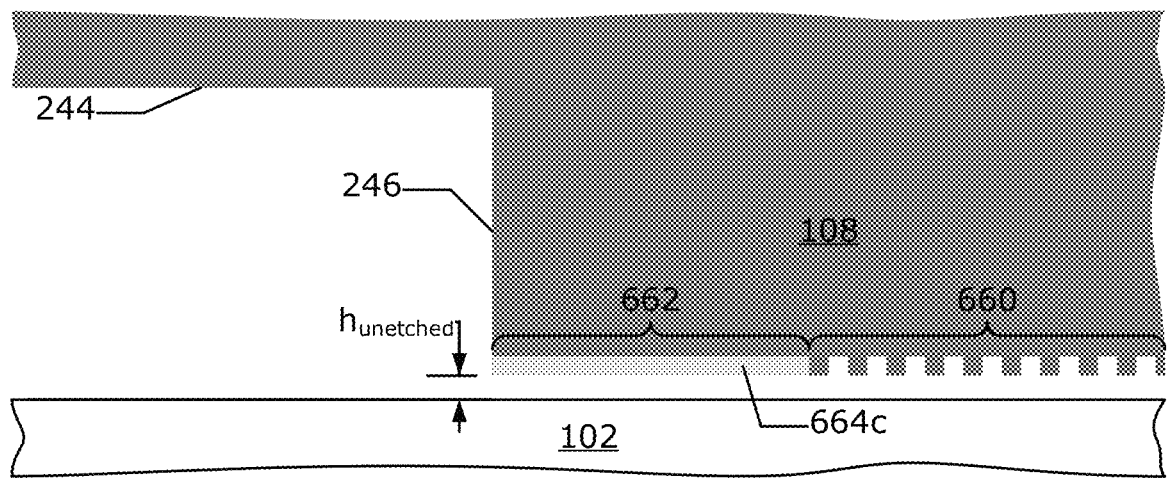
Figure 10C:
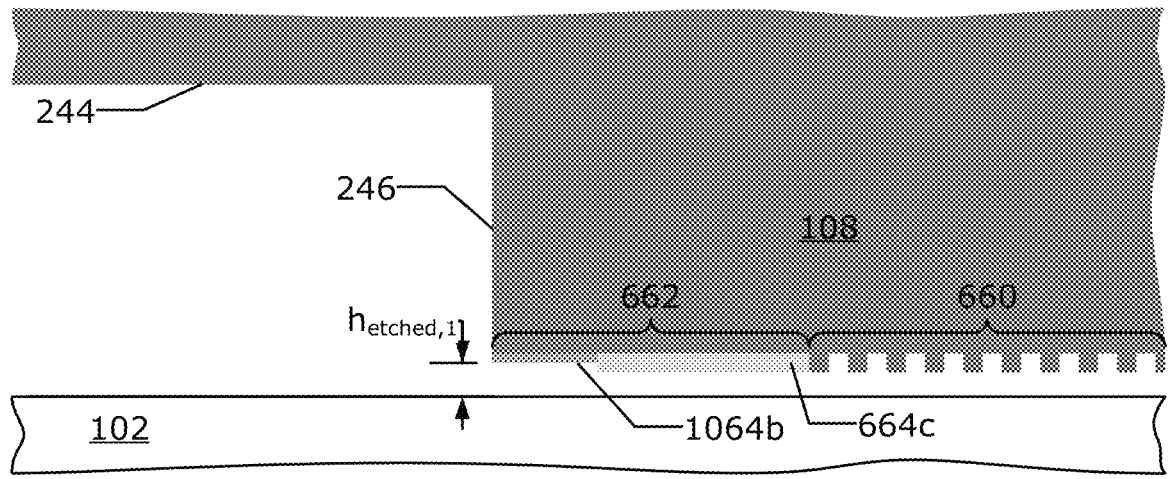
Figure 10D:
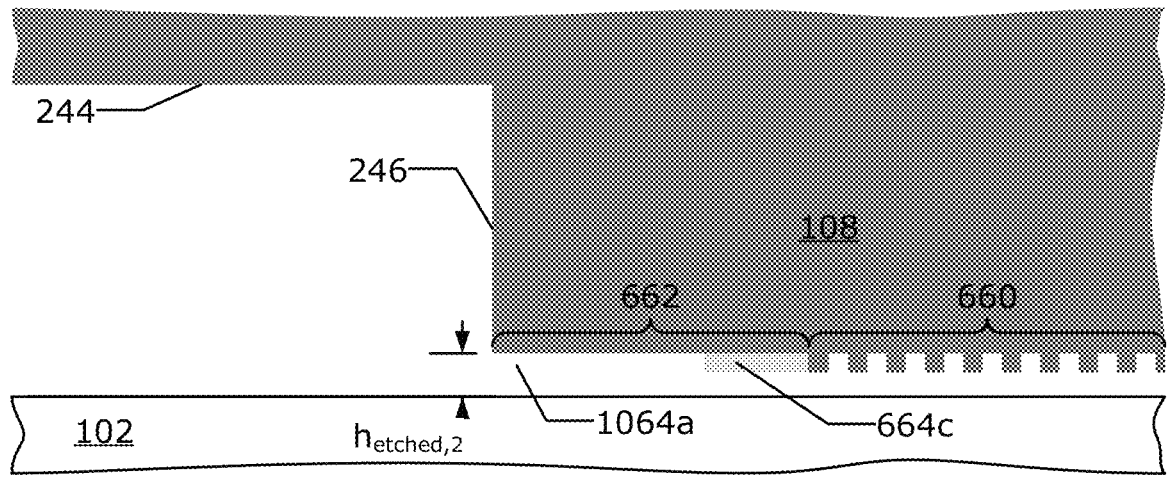
Figure 10E:
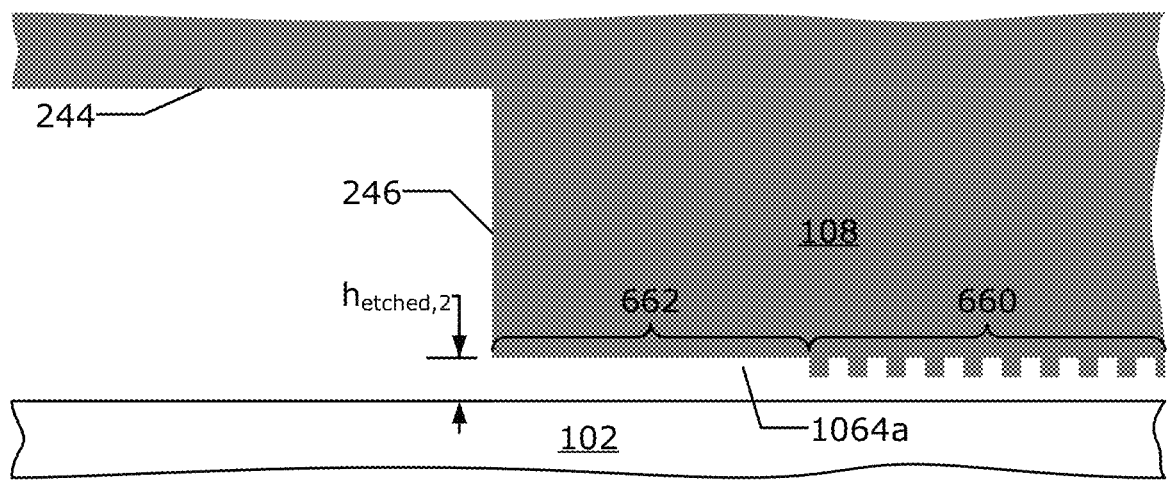

In an alternative embodiment, the template 108 includes a mass velocity variation feature with sub-portions 1064a and 1064b that have been etched to multiple depths as illustrated in FIG. 10A. FIG. 10B is a sectional view along a cut line J illustrated in FIG. 10A of a portion of the template 108 positioned above a substrate 102. FIG. 10C is a sectional view along a cut line K illustrated in FIG. 10A of a portion of the template 108 positioned above a substrate 102 showing a first sub portion 1064b of the mass velocity variation feature that is etched to a depth $h_{etched,1}$. FIG. 10D is a sectional view along a cut line L illustrated in FIG. 10A of a portion of the template 108 positioned above a substrate 102 showing a second sub portion 1064a of the mass velocity variation feature that is etched to a depth $h_{etched,2}$. FIG. 10E is a sectional view along a cut line M illustrated in FIG. 10A of a portion of the template 108 positioned above a substrate 102 showing a second sub portion 1064a of the mass velocity variation feature that is etched to a depth $h_{etched,2}$. In an embodiment, the heights of the sub-portions of the mass velocity variation features are different from each other. In an embodiment, the width $w_{slow,i}$ of each of the sub-portions of the mass velocity variation features may be calculated using equation (8) in a manner similar to equation (6) above. In an embodiment, each of the mass velocity variation features are divided into N sub-portions, wherein N is an integer between 2 and 100.

$$w_{slow,i}(y) = v_{measured} \sqrt{\frac{h_{unetched}^3}{h_{measured}}} * \left( \frac{Td}{h_{etched,i}} - \frac{td(y)}{h_{etched,i} - h_{unetched}} \right) \quad (8)$$

Figure 11A:
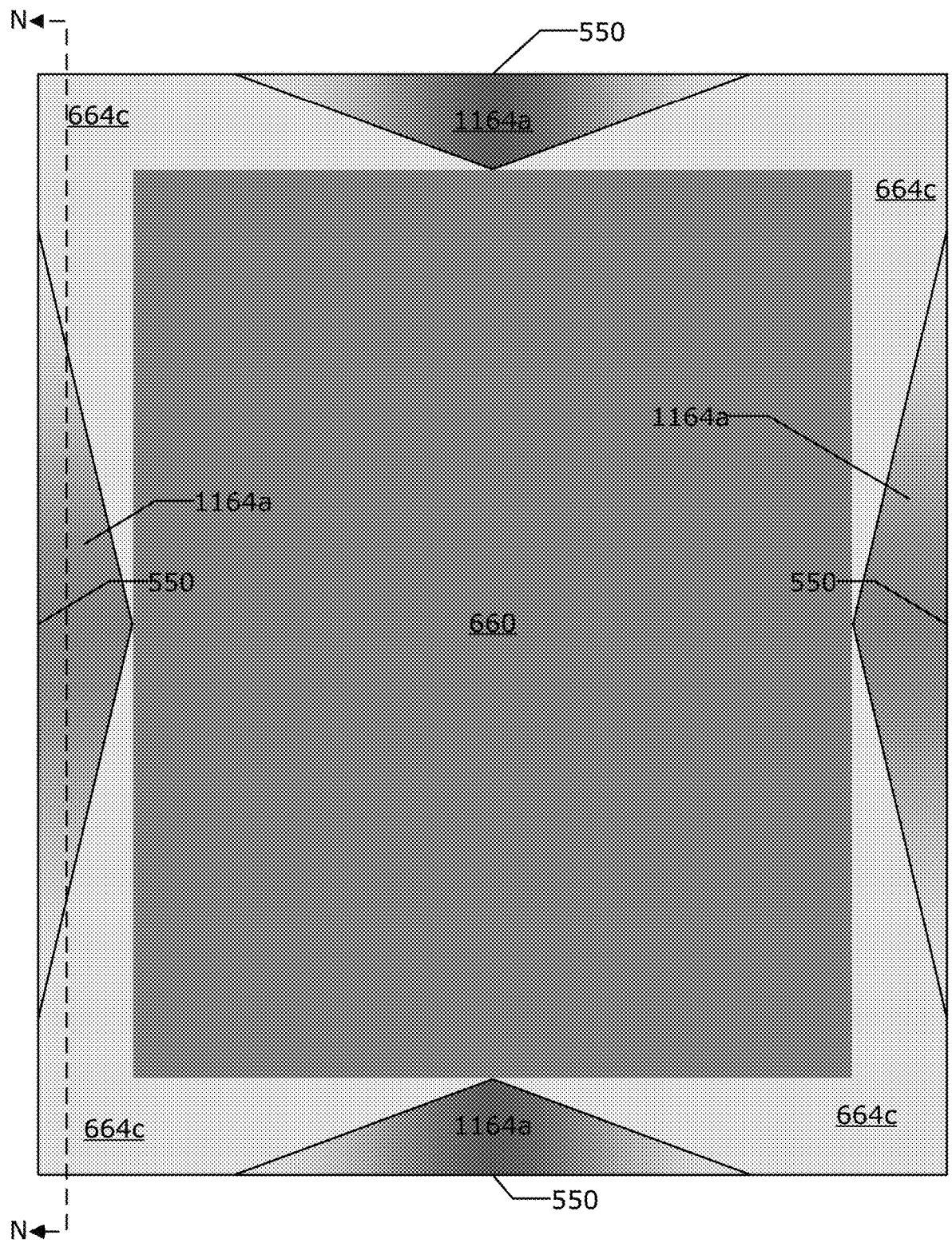
FIGS. 11A-C are illustrations of portions of template with mass velocity variation features as may be used in an exemplary embodiment.
Figure 11B:
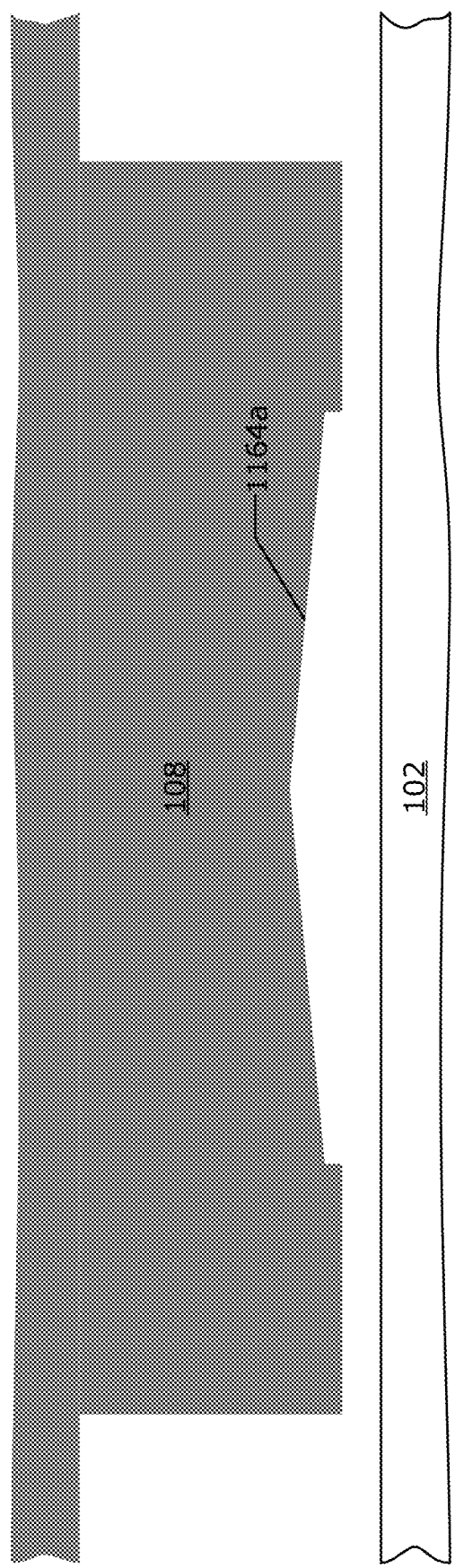

Template with Mass Velocity Variation Feature Etched to a Continuously Variable Depth In an alternative embodiment, the template 108 includes a mass velocity variation feature 1164a that has been etched to continuously variable depths as illustrated in FIGS. 11A-B. FIG. 11B is a sectional view along a cut line N illustrated in FIG. 11A of a portion of the template 108 positioned above a substrate 102. In an embodiment, the depth to which of the mass velocity variation features 1164a are etched varies in a direction parallel to the mesa edge as illustrated in FIGS. 11A-B and described by equation (9) below. This allows for more precise control of the passage of the fluid front 448 through the perimeter region.

$$w_{slow,i}(y) = v_{measured} \sqrt{\frac{h_{unetched}^3}{h_{measured}}} * \left( \frac{Td}{h_{etched}(y)} - \frac{td(y)}{h_{etched}(y) - h_{unetched}} \right) \quad (9)$$

Figure 11C:
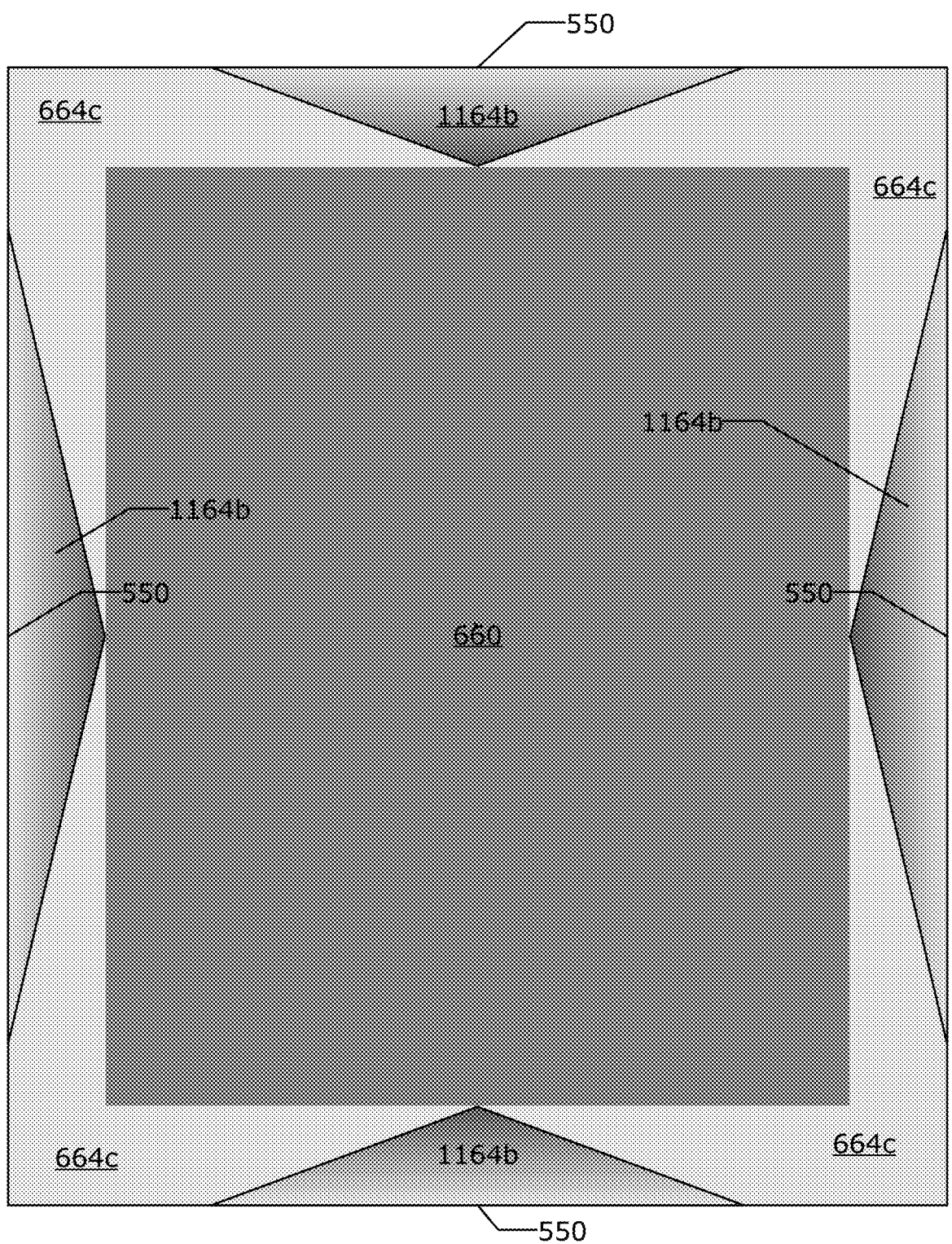

In an embodiment, the depth to which the mass velocity variation features 1164b are etched varies in a direction that is not parallel to the mesa sidewalls as illustrated in FIG. 11C, in which the depth of mesa velocity variation features 1164b is described by the variation in the brightness of the mesa velocity variation features 1164b.

Template with Mass Velocity Variation Feature Alignment Features

In an embodiment, the template 108 includes alignment features in the perimeter region 662 and/or in the feature region 660 near the perimeter region 662. The applicant has found that alignment features are slow to fill. The effect of this slow filling will show up as variations in the filling time td(y). Which will then also show up in corresponding bumps in the width $w_{slow}$ of the mass velocity variation features.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A template for imprinting formable material on a substrate, comprising:
   a first region having pattern features and at least one alignment feature; and
   a second region surrounding the first region;
   wherein the second region includes at least one mass velocity variation feature that alters filling rate of the formable material through the second region, while the template is in contact with the formable material on the substrate;
   wherein the altered filling rate varies from a first filling rate, at a center of an outer edge of the second region to a second filling rate, at corners of the outer edge of the second region;
   wherein the second filling rate is greater than the first filling rate; and
   wherein the mass velocity variation feature has a third filling rate in a region of the at least one alignment feature that is between the first filing rate and the second filling rate.

2. The template for imprinting formable material according to claim 1, wherein the mass velocity variation feature has a first etch depth and a width that proportionally varies from the center of the outer edge of the second region to the corners of the outer edge of the second region.

3. The template for imprinting formable material according to claim 2, wherein the width is wider in the center of the outer edge of the second region relative to the corners of the outer edge of the second region.

4. The template for imprinting formable material according to claim 1, wherein the first region is rectangular, wherein the second region has at least four mass velocity variation features.

5. The template for imprinting formable material according to claim 1, wherein the second region includes a plurality of outer edges, wherein multiple mass velocity variation features are associated with each of the plurality of outer edges.

6. The template for imprinting formable material according to claim 5, wherein each of the multiple mass velocity variation features has a width that varies along the length of each of the multiple mass velocity variation features.

7. The template for imprinting formable material according to claim 1, wherein the mass velocity variation feature has a depth that varies throughout the mass velocity variation feature.

8. An imprinting apparatus comprising:
   a template chuck configured to hold a template;
   a substrate chuck configured to hold a substrate;
   a dispenser configured to dispense a plurality of droplets of formable material in a droplet pattern on the substrate; and a positioning system configured to bring a patterning surface into contact with the formable material in an imprint field of the substrate;

wherein the template has:
  a first region having pattern features; and
  a second region surrounding the first region;
  wherein the second region includes at least one mass velocity variation feature that alters filling rate of the formable material through the second region, while the template is in contact with the formable material on the substrate;
  wherein the altered filling rate varies from a first filling rate at a center of an outer edge of the second region, to a second filling rate at corners of the outer edge of the second region; and
  wherein the second filling rate is greater than the first filling rate;
  wherein an unetched portion of the template is held at a distance $h_{unetched}$ from the substrate;
  wherein the mass velocity variation feature has a width $w_{slow}$ that varies from the center of the outer edge of the second region to the corners of outer edge of the second region in accordance with the following equation:

$$w_{slow}(y) = v_{measured}\sqrt{\frac{h_{unetched}^3}{h_{measured}}} * \left(\frac{Td}{h_{etched}} - \frac{td(y)}{h_{etched} - h_{unetched}}\right)$$

wherein y is a distance from the center of the outer edge of the second region along the outer edge;
  wherein $v_{measured}$ is the measured velocity of a fluid front of formable material between the template and the unetched portion of a test template that is held a height $h_{measured}$ above the substrate when there is no mass velocity variation feature in the region of the test template;
  wherein Td is a measured difference between time it takes the fluid front of formable material to reach the center of the outer edge of the region and time it takes the fluid front to reach the corners of the outer edge of the region when there is no mass velocity variation feature in the region of the test template;
  wherein td(y) is an estimate of the additional time it takes the fluid front to reach a position a distance y relative to the time it takes the fluid front to reach the center of the outer edge of the region;
  wherein $h_{etched}$ is a height of a gap between the mass velocity variation feature and the substrate.

9. The imprinting apparatus according to claim 8, wherein td(y) is a linear function that intercepts with zero at center of the outer edge of the region.

10. The imprinting apparatus according to claim 8, wherein td(y) is a linear function that intercepts with zero at center of the outer edge of the region, except for one or more increases in the additional time associated with one or more alignment features in the template.

11. An imprinting apparatus comprising:
  a template chuck configured to hold a template;
  a substrate chuck configured to hold a substrate;
  a dispenser configured to dispense a plurality of droplets of formable material in a droplet pattern on the substrate; and
  a positioning system configured to bring a patterning surface into contact with the formable material in an imprint field of the substrate;
  wherein the template has:
    a first region having pattern features; and
    a second region surrounding the first region;
    wherein the second region includes at least one mass velocity variation feature that alters filling rate of the formable material through the second region, while the template is in contact with the formable material on the substrate;
    wherein the altered filling rate varies from a first filling rate at a center of an outer edge of the second region, to a second filling rate at corners of the outer edge of the second region; and
    wherein the second filling rate is greater than the first filling rate;
    wherein an unetched portion of the template is held at a distance $h_{unetched}$ from the substrate;
    wherein the mass velocity variation feature is divided into N sub-portions in which N is greater than two; each sub-portion i has a width $w_{slow,i}$ that varies from the center of the outer edge of the second region to the corners of outer edge of the second region in accordance with the following equation:

$$w_{slow,i}(y) = v_{measured}\sqrt{\frac{h_{unetched}^3}{h_{measured}}} * \left(\frac{Td}{h_{etched,i}} - \frac{td(y)}{h_{etched,i} - h_{unetched}}\right)$$

wherein y is a distance from the center of the outer edge of the second region along the outer edge;
    wherein $v_{measured}$ is the measured velocity of a fluid front of formable material between the template and the unetched portion of a test template that is held a height $h_{measured}$ above the substrate when there is no mass velocity variation feature in the region of the test template;
    wherein Td is a measured difference between time it takes the fluid front of formable material to reach the center of the outer edge of the region and time it takes the fluid front to reach the corners of the outer edge of the region when there is no mass velocity variation feature in the region of the test template;
    wherein td(y) is an estimate of the additional time it takes the fluid front to reach a position a distance y relative to the time it takes the fluid front to reach the center of the outer edge of the region;
    wherein $h_{etched,i}$ is a height of a gap between the sub-portion i of the mass velocity variation feature and the substrate.

12. The imprinting apparatus according to claim 8, wherein the second region has a plurality of mass velocity variation features that have a width $w_{slow,m}$ that varies from the center of the outer edge of the second region to the corners of outer edge of the second region and the width $w_{slow,m}$ also varies in accordance with the droplet pattern on the substrate.

* * * * *